(12) United States Patent
Imai et al.

(10) Patent No.: US 9,863,828 B2
(45) Date of Patent: Jan. 9, 2018

(54) PHYSICAL QUANTITY SENSOR, ELECTRONIC DEVICE, ALTIMETER, ELECTRONIC APPARATUS, AND MOBILE OBJECT

(71) Applicant: Seiko Epson Corporation, Tokyo (JP)

(72) Inventors: Hideo Imai, Shimosuwa (JP); Satoshi Nakajima, Okaya (JP); Haruki Ito, Chino (JP)

(73) Assignee: Seiko Epson Corporation (JP)

( * ) Notice: Subject to any disclaimer, the term of this patent is extended or adjusted under 35 U.S.C. 154(b) by 222 days.

(21) Appl. No.: 14/738,067

(22) Filed: Jun. 12, 2015

(65) Prior Publication Data

US 2015/0369681 A1    Dec. 24, 2015

(30) Foreign Application Priority Data

Jun. 18, 2014 (JP) ................. 2014-125481
Jun. 18, 2014 (JP) ................. 2014-125482

(51) Int. Cl.

| | |
|---|---|
| *G01L 9/06* | (2006.01) |
| *G01L 19/04* | (2006.01) |
| *G01L 19/14* | (2006.01) |
| *G01L 9/00* | (2006.01) |
| *G01C 5/06* | (2006.01) |

(52) U.S. Cl.
CPC .............. *G01L 9/0042* (2013.01); *G01C 5/06* (2013.01); *G01L 9/0054* (2013.01); *G01L 19/145* (2013.01)

(58) Field of Classification Search
CPC ..... G01L 9/00; G01L 9/04; G01L 9/06; G01L 9/08; G01L 9/10; G01L 9/12; G01L 9/0042; G01L 9/0054; G01L 19/02; G01L 19/04; G01L 19/14; G01L 19/145; G01C 5/06

See application file for complete search history.

(56) References Cited

U.S. PATENT DOCUMENTS

| | | | | |
|---|---|---|---|---|
| 6,821,822 B1 * | 11/2004 | Sato | .............. | H01L 21/565 |
| | | | | 257/678 |
| 7,468,552 B2 * | 12/2008 | Ohta | .............. | B81B 7/0058 |
| | | | | 257/686 |
| 7,749,797 B2 | 7/2010 | Bauer et al. | | |
| 9,324,586 B2 * | 4/2016 | Theuss | .............. | H01L 21/565 |
| 9,446,944 B2 * | 9/2016 | Ernst | .............. | B81B 7/0048 |
| 2001/0028072 A1 | 10/2001 | Aoki et al. | | |
| 2007/0069354 A1 * | 3/2007 | Dangelmaier | .............. | B81B 7/0058 |
| | | | | 257/678 |

(Continued)

FOREIGN PATENT DOCUMENTS

| | | | | |
|---|---|---|---|---|
| FR | 2686692 A1 * | 7/1993 | ......... | G01L 19/0645 |
| JP | 02-196938 A | 8/1990 | | |

(Continued)

*Primary Examiner* — Nguyen Ha
*Assistant Examiner* — Wyn Ha
(74) *Attorney, Agent, or Firm* — Harness, Dickey & Pierce, P.L.C.

(57) ABSTRACT

A physical quantity sensor includes: a physical quantity sensor chip which detects a physical quantity and generates an electrical signal; a package which has an internal space and accommodates the physical quantity sensor chip in the internal space; and a first wire which connects the package and the physical quantity sensor chip together. The physical quantity sensor chip is moored in the internal space by the first wire.

19 Claims, 32 Drawing Sheets

(56) References Cited

U.S. PATENT DOCUMENTS

| | | | |
|---|---|---|---|
| 2007/0279845 A1* | 12/2007 | Kuhnt | G01L 19/0645 361/679.01 |
| 2008/0229827 A1 | 9/2008 | Ozawa | |
| 2009/0026558 A1 | 1/2009 | Bauer et al. | |
| 2010/0315287 A1* | 12/2010 | Karpitski | G01S 19/03 342/357.28 |
| 2014/0007649 A1* | 1/2014 | Niemann | G01N 33/0009 73/23.2 |
| 2014/0285976 A1* | 9/2014 | Kobayashi | H05K 3/04 361/736 |
| 2015/0377734 A1* | 12/2015 | Ihle | G01L 19/04 73/706 |

FOREIGN PATENT DOCUMENTS

| | | | | |
|---|---|---|---|---|
| JP | 2000031355 A | * | 1/2000 | H01L 23/36 |
| JP | 2001-153746 A | | 6/2001 | |
| JP | 03-262972 B2 | | 3/2002 | |
| JP | 3578347 B2 | | 10/2004 | |
| JP | 2008-512647 A | | 4/2008 | |
| JP | 2008-235487 A | | 10/2008 | |
| JP | 2010-021210 A | | 1/2010 | |
| WO | WO-2006-026951 A1 | | 3/2006 | |

\* cited by examiner

PHYSICAL QUANTITY SENSOR, ELECTRONIC DEVICE, ALTIMETER, ELECTRONIC APPARATUS, AND MOBILE OBJECT

CROSS REFERENCE

This application claims benefit of Japanese Applications JP 2014-125481, filed on Jun. 18, 2014 and JP 2014-125482, filed on Jun. 18, 2014. The disclosures of the prior applications are hereby incorporated by reference herein in their entireties.

BACKGROUND

1. Technical Field

The present invention relates to a physical quantity sensor, an electronic device, an altimeter, an electronic apparatus, and a mobile object.

2. Related Art

According to the related art, as a physical quantity sensor (electronic device), a pressure sensor having a sensor chip which detects pressure and generates an electrical signal corresponding to the detection value and a package which accommodates this sensor chip is known (see, for example, JP-A-2001-153746).

In such a pressure sensor, generally, the sensor chip has a diaphragm which flexes by being pressurized and a sensor element provided on the diagram. As the sensor element detects the flexure of the diaphragm caused by the application of pressure to the diaphragm, the pressure sensor detects the pressure applied to the diaphragm.

In the pressure sensor with this configuration, according to the related art, the sensor chip is bonded to the bottom surface of the package via a low-elasticity material such as a fluorosilicone-based adhesive, as disclosed in JP-A-2001-153746.

However, in this configuration, there is a problem that since the flexure generated in the package is transmitted to the sensor chip via the adhesive, an unwanted stress is applied to the sensor chip, consequently lowering the detection accuracy of the sensor chip. Therefore, the related-art pressure sensor cannot detect an applied pressure with high accuracy.

Meanwhile, for example, in the electronic component (sensor chip) disclosed in JP-A-2008-235487, an electrode pad is connected to an external terminal via a bonding wire. This electronic component has a cavity to relax an external stress generated from the bonding wire, below (directly below) the electrode pad. However, even with such a configuration, particularly if the arrangement of the bonding wire is uneven (asymmetrical), the unevenness causes an external stress. Therefore, the sensor accuracy (property) falls.

SUMMARY

An advantage of some aspects of the invention is that a physical quantity sensor in which an external stress applied to a sensor chip (electronic component) is reduced and which has a sensor chip having excellent detection accuracy, and an altimeter, an electronic apparatus and a mobile object that have this physical quantity sensor and are highly reliable, are provided.

The invention can be implemented as the following applications examples.

APPLICATION EXAMPLE 1

This application example is directed to a physical quantity sensor including: a physical quantity sensor chip which detects a physical quantity and generates an electrical signal; a package which has an internal space and accommodates the physical quantity sensor chip in the internal space; and a first wire which connects the package and the physical quantity sensor chip together. The physical quantity sensor chip is moored in the internal space by the first wire.

Thus, since the propagation of the flexure of the package to the sensor chip can be reduced, the application of a stress to the sensor chip due to the flexure of the package can be reduced. Therefore, the detection accuracy of the sensor chip can be enhanced and therefore a pressure sensor having excellent detection accuracy can be provided.

APPLICATION EXAMPLE 2

In the physical quantity sensor according to this application example, it is preferable that the physical quantity sensor is surrounded by a liquid or gel-type filler.

Thus, since the physical quantity sensor chip can be protected (dustproof and waterproof) and the filler functions as a physical quantity transmission medium (pressure transmission medium), the physical quantity (for example, pressure) applied to the physical quantity sensor can be transmitted efficiently to the physical quantity sensor chip. Moreover, since the filler is liquid or gel-type, the application of a stress to the physical quantity sensor chip due to the flexure of the package can be reduced further.

APPLICATION EXAMPLE 3

In the physical quantity sensor according to this application example, it is preferable that the filler includes a pliable resin.

Thus, a gel-type filler can be obtained more easily. Also, if the filler is gel-type, the fluctuation of the position of the physical quantity sensor chip in the internal space can be reduced and therefore highly accurate detection can be achieved without being influenced by the change in the posture of the physical quantity sensor.

APPLICATION EXAMPLE 4

In the physical quantity sensor according to this application example, it is preferable that the first wire is electrically conductive.

Thus, the wire can be provided with the function of an electrical wire.

APPLICATION EXAMPLE 5

In the physical quantity sensor according to this application example, it is preferable that the package has a flexible wiring board with at least a part thereof protruding into the internal space from the package, and that the first wire is connected to the flexible wiring board in the internal space.

Thus, the application of a stress due to the physical quantity sensor chip to the flexure of the package can be reduced further.

APPLICATION EXAMPLE 6

In the physical quantity sensor according to this application example, it is preferable that an IC chip is arranged in the internal space.

With this IC chip, the magnitude of the physical quantity (for example, pressure) applied to the physical quantity sensor can be calculated on the basis of the electrical signal generated in the sensor chip.

APPLICATION EXAMPLE 7

In the physical quantity sensor according to this application example, it is preferable that the physical quantity sensor has a second wire which connects the package and the IC chip together, and that the IC chip is moored in the internal space by the second wire.

Thus, the application of a stress to the IC chip due to the flexure of the package because of the propagation of the flexure of the package to the IC chip can be reduced further. Therefore, the magnitude of the physical quantity (for example, pressure) applied to the physical quantity sensor can be calculated with higher accuracy.

APPLICATION EXAMPLE 8

In the physical quantity sensor according to this application example, it is preferable that the IC chip is integrally formed with the physical quantity sensor chip.

Thus, a reduction in the size and height of the physical quantity sensor can be achieved.

APPLICATION EXAMPLE 9

In the physical quantity sensor according to this application example, it is preferable that the physical quantity sensor chip is a pressure sensor chip which detects pressure.

Thus, pressure can be detected.

APPLICATION EXAMPLE 10

This application example is directed to an electronic device including: a wiring board; an electronic component; a first wire which electrically connects the wiring board and the electronic component together; and a second wire which connects the wiring board and the electronic component together in such a way as to adjust a stress generated on the electronic component by the first wire.

Thus, an electronic device in which the external stress (unwanted stress) applied to an electronic component can be reduced is provided.

APPLICATION EXAMPLE 11

In the electronic device according to this application example, it is preferable that the electronic device has a plurality of the first wires, and that an arrangement of the first wires is asymmetrical about a center part of the electronic component, as viewed in a plan view.

Thus, the degree of freedom in the arrangement of the first wires is increased.

APPLICATION EXAMPLE 12

In the electronic device according to this application example, it is preferable that the second wire is not electrically connected to the wiring board.

Thus, the generation of an unintended short circuit or parasitic capacitance, the generation of a noise or the like can be reduced.

APPLICATION EXAMPLE 13

In the electronic device according to this application example, it is preferable that the second wire is not electrically connected to the electronic component.

Thus, the generation of an unintended short circuit or parasitic capacitance, the generation of a noise or the like can be reduced.

APPLICATION EXAMPLE 14

In the electronic device according to this application example, it is preferable that a circuit is provided on the wiring board.

Thus, an output or the like from the electronic component can be processed on the wiring board.

APPLICATION EXAMPLE 15

In the electronic device according to this application example, it is preferable that the electronic component is a pressure sensor element having a diaphragm.

Thus, the electronic device can be used as a pressure sensor device and the convenience thereof is enhanced.

APPLICATION EXAMPLE 16

In the electronic device according to this application example, it is preferable that the first wire and the second wire contain a same metal material as a principal material.

Thus, the standardization of the first wire and the second wire can be achieved and the device configuration can be simplified.

APPLICATION EXAMPLE 17

In the electronic device according to this application example, it is preferable that the wiring board and the electronic component are directly connected together by the first wire and the second wire.

Thus, the total length of the wires is shortened and the generation of a noise can be reduced.

APPLICATION EXAMPLE 18

This application example is directed to a method for manufacturing an electronic device including: connecting a wiring board and an electronic component together via a plurality of first wires and a plurality of second wires; measuring the electronic component; and cancelling at least one of the connections via the plurality of second wires according to need, on the basis of a measurement result in the measuring.

Thus, an electronic device in which the external stress (unwanted stress) applied to an electronic component can be reduced is provided.

APPLICATION EXAMPLE 19

In the method for manufacturing the electronic device according to this application example, it is preferable that, in the measuring, an electrical characteristic of the electronic component is measured.

Thus, the stress applied to the electronic component can be measured (estimated) properly.

APPLICATION EXAMPLE 20

In the method for manufacturing the electronic device according to this application example, it is preferable that, in the cancelling, the second wire is disconnected.

Thus, the connection of the second wire can be cancelled easily.

APPLICATION EXAMPLE 21

In n the method for manufacturing the electronic device according to this application example, it is preferable that, in the cancelling, the second wire is disconnected or removed using a laser.

Thus, the second wire can be disconnected or removed easily.

APPLICATION EXAMPLE 22

This application example is directed to a method for manufacturing an electronic device including: connecting a wiring board and an electronic component together via a plurality of first wires and a second wire; measuring the electronic component; and adding the second wire for connecting the wiring board and the electronic component together, according to need, on the basis of a measurement result in the measuring.

Thus, an electronic device in which the external stress (unwanted stress) applied to an electronic component can be reduced is provided.

APPLICATION EXAMPLE 23

This application example is directed to an altimeter including the physical quantity sensor or the electronic device according to the application example described above.

Thus, a highly reliable altimeter is provided.

APPLICATION EXAMPLE 24

This application example is directed to an electronic apparatus including the physical quantity sensor or the electronic device according to the application example described above.

Thus, a highly reliable electronic apparatus is provided.

APPLICATION EXAMPLE 25

This application example is directed to a mobile object including the physical quantity sensor or the electronic device according to the application example described above.

Thus, a highly reliable mobile object is provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, the physical quantity sensor (electronic device), the altimeter, the electronic apparatus and the mobile object according to the invention will be described in detail on the basis of the embodiments shown in the accompanying drawings.

1. Physical Quantity Sensor (Electronic Device)

First Embodiment

Figure 1:
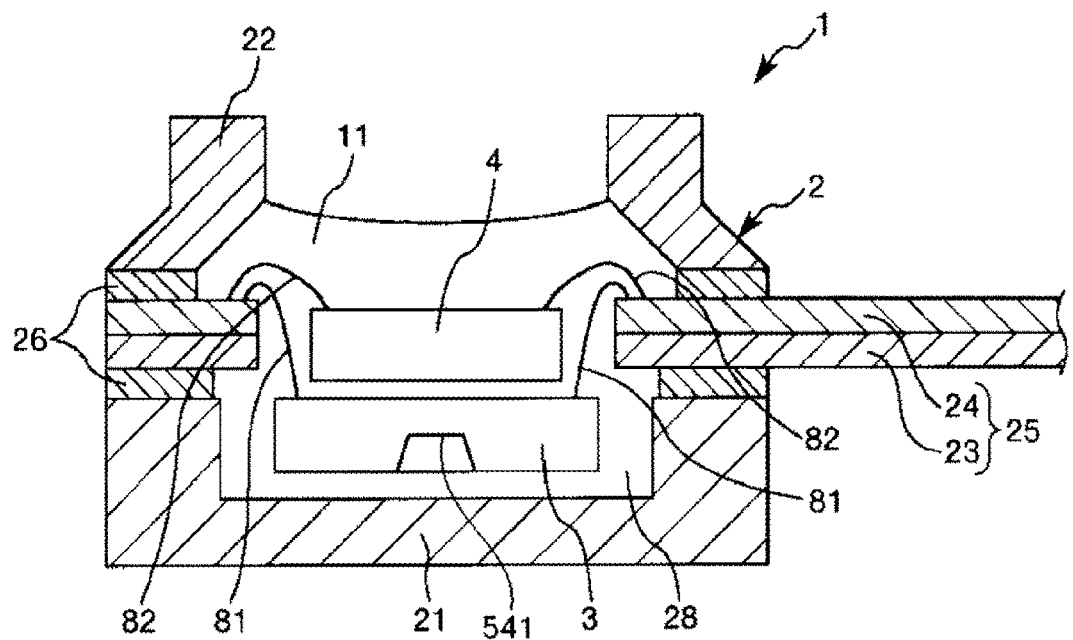
FIG. 1 a cross-sectional view showing a first embodiment of the physical quantity sensor according to the invention.
Figure 2:
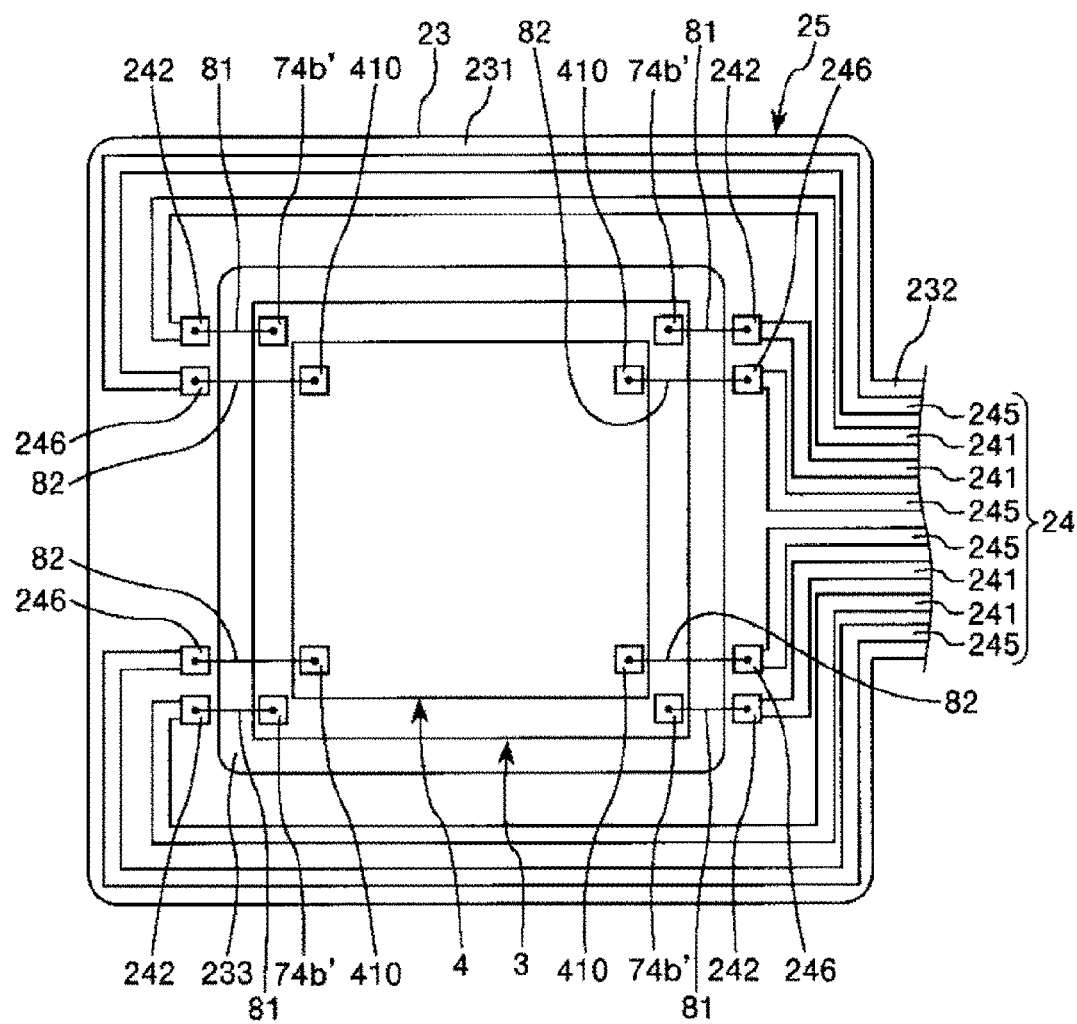
FIG. 2 is a plan view of the physical quantity sensor shown in FIG. 1.
Figure 3:
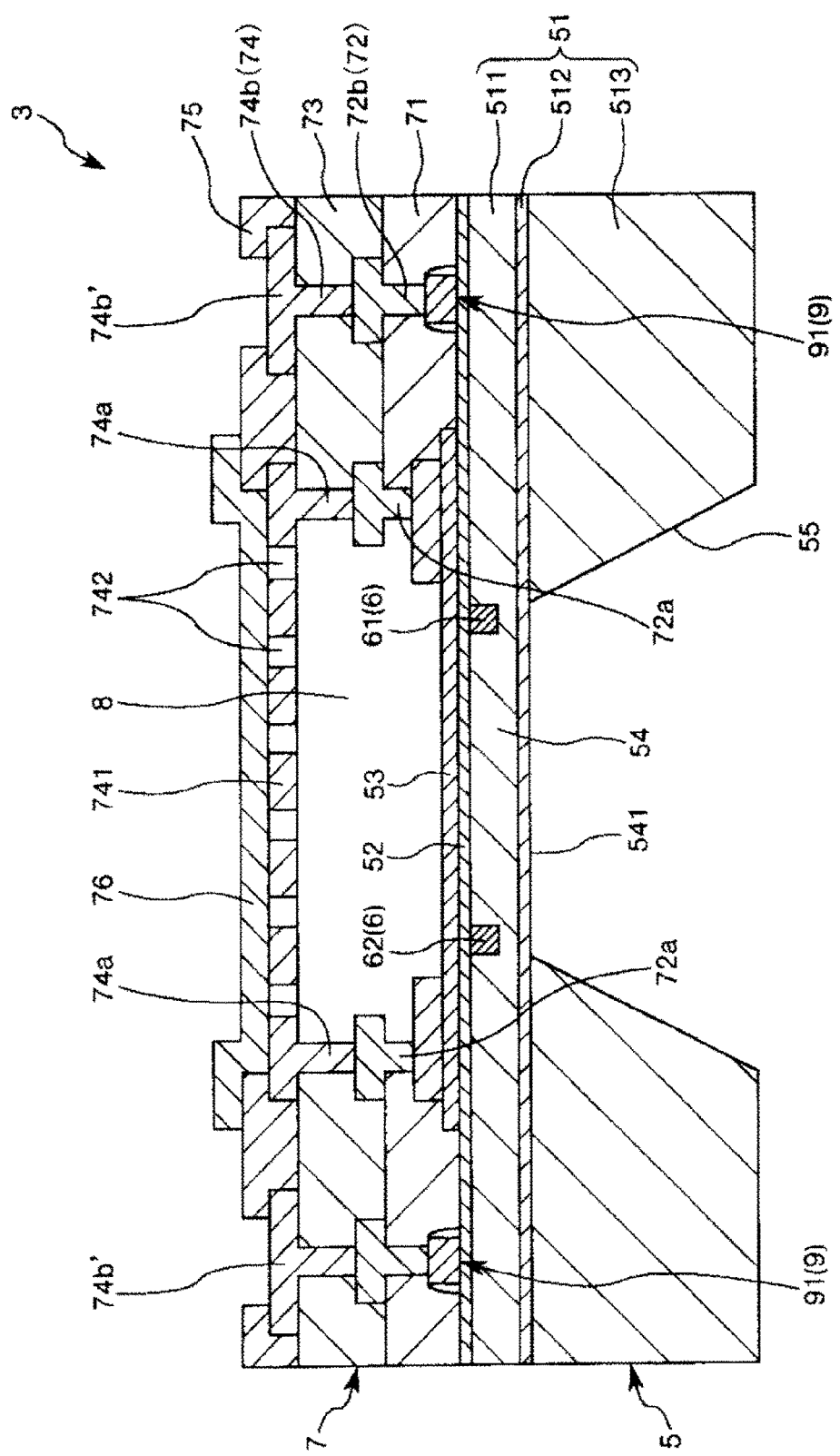
FIG. 3 is a cross-sectional view showing a physical quantity sensor chip provided in the physical quantity sensor shown in FIG. 1.
Figure 4:
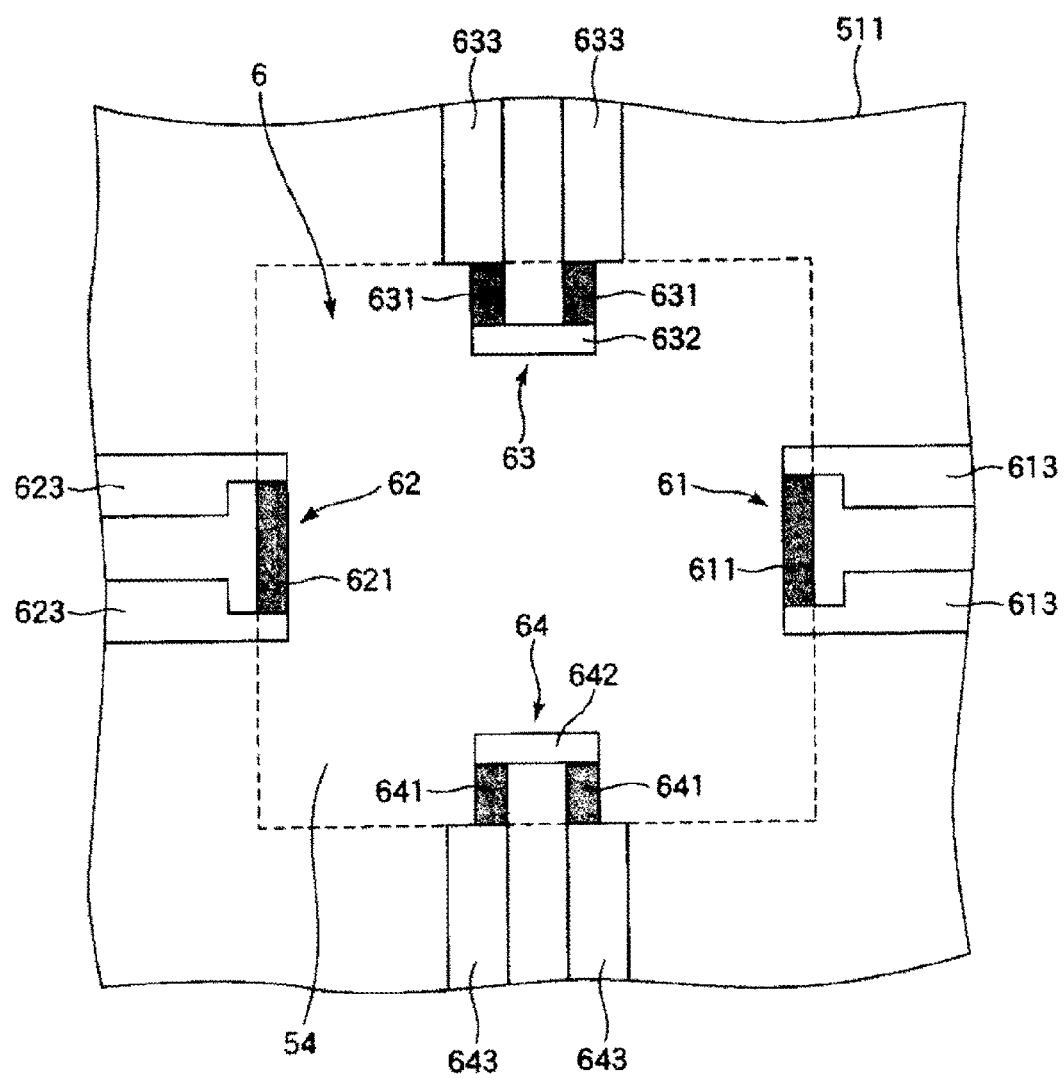
FIG. 4 is a plan view showing a sensor element of the physical quantity sensor chip shown in FIG. 3.
Figure 5:
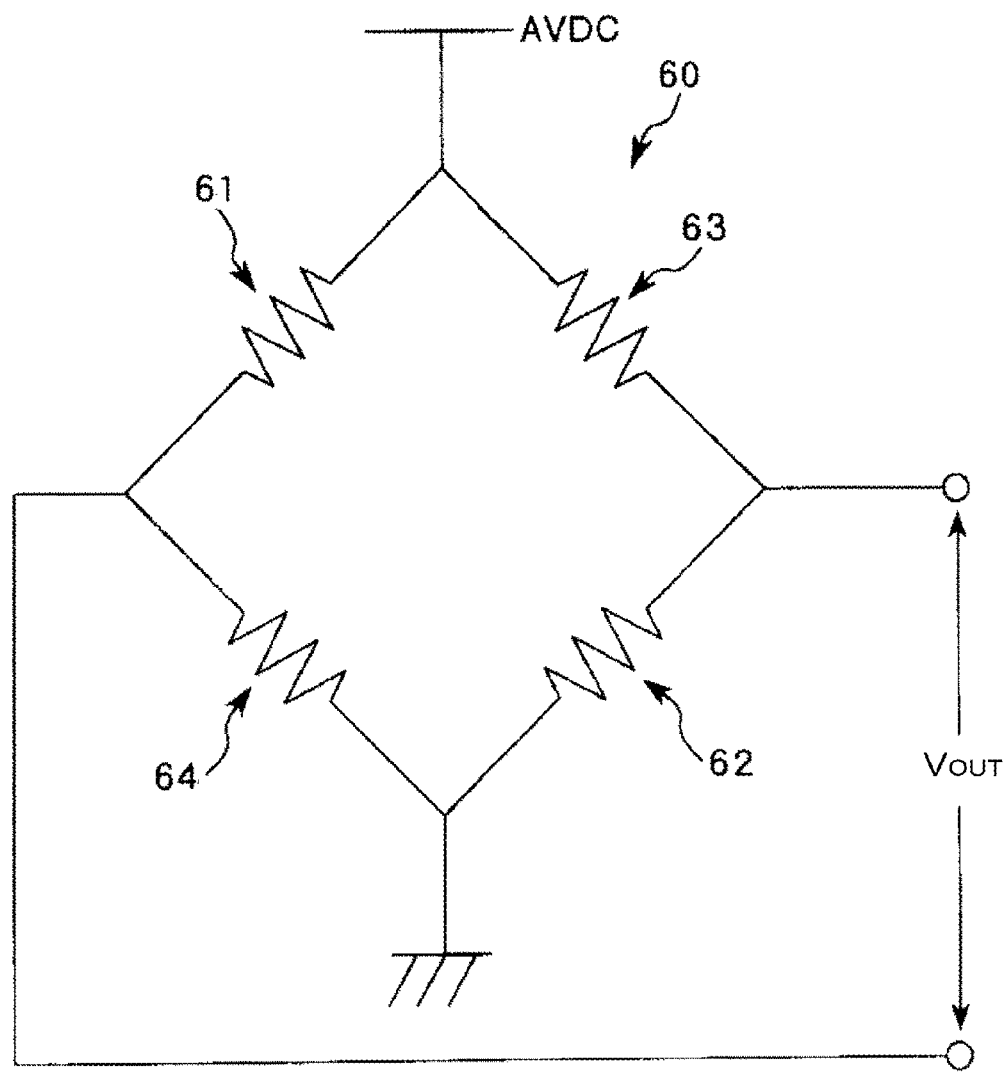
FIG. 5 shows a bridge circuit including the sensor element shown in FIG. 4.
Figure 6:
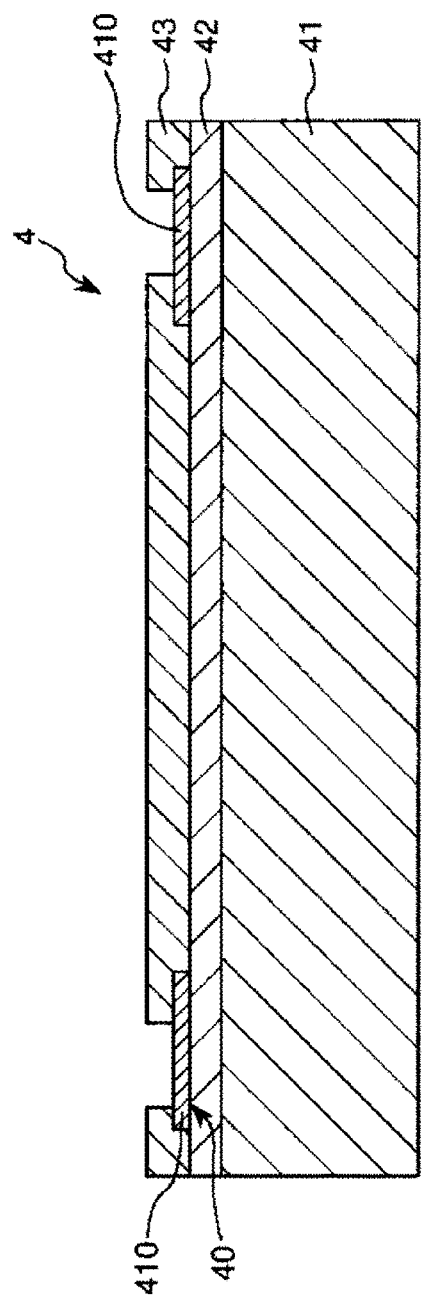
FIG. 6 is a cross-sectional view showing an IC chip provided in the physical quantity sensor shown in FIG. 1.

FIG. 1 is a cross-sectional view showing a first embodiment of the physical quantity sensor according to the invention. FIG. 2 is a plan view of the physical quantity sensor shown in FIG. 1. FIG. 3 is a cross-sectional view showing a physical quantity sensor chip provided in the physical quantity sensor shown in FIG. 1. FIG. 4 is a plan view showing a sensor element of the physical quantity sensor chip shown in FIG. 3. FIG. 5 shows a bridge circuit including the sensor element shown in FIG. 4. FIG. 6 is a cross-sectional view showing an IC chip provided in the physical quantity sensor shown in FIG. 1. In FIG. 2, the illustration of a housing 22 is omitted as a matter of convenience for explanation. In the description below, the top side in FIGS. 1, 3 and 6 is referred to as the "top" and the bottom side is referred to as the "bottom".

A physical quantity sensor (electronic device) 1 shown in FIG. 1 is a pressure sensor that can detect pressure. As the physical quantity sensor 1 is thus configured as a pressure sensor, the physical quantity sensor can be installed in various electronic apparatuses.

This physical quantity sensor 1 has a sensor chip (physical quantity sensor chip) 3 as an electronic component which detects pressure and generates an electrical signal, an IC chip 4, a package (container) 2 which accommodates the sensor chip 3 and the IC chip 4, a bonding wire (wire) 81 which connects the sensor chip 3 to the package 2, a bonding wire (wire) 82 which connects the IC chip 4 to the package 2, and a filler 11 which surrounds (covers) the sensor chip 3 and the IC chip 4 inside the package 2, as shown in FIG. 1.

Hereinafter, each of these parts will be described in order.

Package

The package 2 has an internal space 28 for accommodating the sensor chip 3 and the IC chip 4. The internal space 28 opens toward the top of a housing 22.

As shown in FIG. 1, the package 2 has a base (bottom section) 21, the housing (lid) 22, and a flexible wiring board 25. These parts are bonded together in such a way as to hold the flexible wiring board 25 between the base 21 and the housing 22. The bonding of the base 21 and the flexible wiring board 25, and the bonding of the housing 22 and the flexible wiring board 25, are respectively carried out via an adhesive layer 26 made up of an adhesive. This adhesive is not particularly limited. For example, a silicone-based adhesive, epoxy-based adhesive or the like can be used. It should be noted that, depending on the materials that form the base 21, the flexible wiring board 25 and the housing 22, the bonding of the base 21, the flexible wiring board 25 and the housing 22 with each other may be carried out by various bonding methods such as anodic bonding or direct bonding, without using an adhesive layer.

The base 21 forms the bottom surface of the package 2. In this embodiment, the base 21 is in the shape of a flat plate as a whole, having a square shape as viewed in a plan view. The material for forming the base 21 is not particularly limited. However, for example, insulative materials including: oxide ceramics such as alumina, silica, titania, and zirconia; various ceramics like nitride ceramics such as silicon nitride, aluminum nitride, and titanium nitride; and various resin materials such as polyethylene, polyamide, polyimide, polycarbonate, acrylic resin, ABS resin, and epoxy resin, may be used. Of these, one type or a combination of two types or more may be used. Of these materials, various ceramics are preferable. This enables provision of the package 2 with excellent mechanical strength. The shape of the base 21 as viewed in a plan view may also be, for example, circular, rectangular, pentagonal or more polygonal.

The housing 22 forms the lid section of the package 2. In this embodiment, the housing 22 is tubular as a whole and, as viewed in a plan view, square on the bottom side and circular on the top side. The housing 22 is formed by a first part where the outer diameter and inner diameter thereof gradually decrease to a halfway point along the package height from the bottom end toward the top end, and a second part where the outer diameter and inner diameter are substantially constant from the halfway point toward the top end. The housing 22 is square in the first part, as viewed in a plan view, and circular in the second part, as viewed in a plan view. The shape of the housing 22 may also be, for example, cylindrical as a whole. Also, as the material for forming the housing 22, similar materials to those listed as the materials for forming the base 21 can be used.

The flexible wiring board 25 is situated between the base 21 and the housing 22 and has the function of taking electrical signals from the sensor chip 3 and the IC chip 4 out of the package 2. The flexible wiring board 25 is formed by a flexible substrate 23 and a wiring 24 formed on the top surface side of the substrate 23.

As shown in FIG. 2, the substrate 23 is formed by a frame body 231 which is in the shape of a square frame as viewed in a plan view and has an opening 233 in a center part, and a band body 232 which is in the shape of a band integrally formed on one side of the frame body 231 in such a way as to protrude outward. An inner edge part of the frame body 231 is arranged to protrude into the internal space 28 along the entire circumference.

The material for forming the substrate 23 is not particularly limited as long as the material is flexible. For example, polyimide, polyethylene terephthalate (PET), polyethylene naphthalate (PEN), polyether sulfone (PES) and the like can be used. On these, one type or a combination of two types or more may be used.

The wiring 24 is electrically conductive and provided (drawn around) on the frame body 231 and the band body 232, as shown in FIG. 2. This wiring 24 has four wiring parts 241 for taking electrical signals from the sensor chip 3 out of the package 2, and four wiring parts 245 for taking electrical signals from the IC chip 4 out of the package 2.

On the side of the internal space 28 of each wiring part 241, a terminal 242 for electrically connecting a connection terminal 74b', later described, of the sensor chip 3 via the bonding wire 81 is provided. Meanwhile, on the side of the internal space 28 of each wiring part 245, a terminal 246 for electrically connecting a connection terminal 410, later described, of the IC chip 4 via the bonding wire 82 is provided. Also, for example, if the motherboard or the like of an electronic apparatus or mobile object, later described, is electrically connected to the outer end parts of the wiring parts 241, 245, electrical signals from the sensor chip 3 and the IC chip 4 can be taken out of the package 2.

The number of wiring parts provided in the wiring 24 is not limited to the above example and can be properly set according to the number of the connection terminals 74b' provided on the sensor chip 3 and the number of the connection terminals 410 provided on the IC chip 4.

The material for forming the wiring 24 is not particularly limited as long as the material is electrically conductive. For example, metals such as Ni, Pt, Li, Mg, Sr, Ag, Cu, Co, and Al, alloys containing these such as MgAg, AlLi, and CuLi, and oxides such as ITO and $SnO_2$, and the like can be used. Of these, one type or a combination of two types or more can be used.

Sensor Chip

As shown in FIG. 3, the sensor chip 3 has a substrate 5, a sensor element 6, an element peripheral structure 7, a cavity section 8, and a semiconductor circuit 9. Hereinafter, each of these parts will be described in order.

The substrate 5 is formed by stacking a first insulating film 52 made up of a silicon oxide film ($SiO_2$ film) and a second insulating film 53 made up of a silicon nitride film (SiN film) in this order on a semiconductor substrate 51 made up of an SOI substrate (a substrate made up of a first Si layer 511, an $SiO_2$ layer 512 and a second Si layer 513 stacked in this order). However, the semiconductor substrate 51 is not limited to an SOI substrate. For example, a silicon substrate can also be used.

Also, a diaphragm 54 which is thinner than the surrounding parts and flexes and deforms on receiving pressure is provided on the semiconductor substrate 51. This diaphragm 54 is formed by providing a closed-bottom recess section 55 on the bottom surface of the semiconductor substrate 51, and the bottom surface thereof (the bottom surface of the recess section 55) is a pressure receiving surface 541.

The semiconductor circuit (circuit) 9 is built in on and above the semiconductor substrate 51. The semiconductor circuit 9 includes circuit elements such as an active element like a MOS transistor 91, a capacitor, an inductor, a resistor, a diode and wiring, formed according to need. In FIG. 3, only the MOS transistor 91 of the semiconductor circuit 9 is illustrated as a matter of convenience for explanation.

The sensor element 6 has four piezoresistive elements (flexure amount detection elements) 61, 62, 63, 64 which are provided in the diaphragm 54, as shown in FIG. 4. The four piezoresistive elements 61, 62, 63, 64 are provided corresponding respectively to the respective sides of the diaphragm 54 having a quadrilateral shape as viewed in a plan view.

The piezoresistive elements 61, 62 have piezoresistive parts 611, 621 provided at outer edge parts of the diaphragm 54, and wirings 613, 623 connected to both ends of the piezoresistive parts 611, 621. Meanwhile, the piezoresistive elements 63, 64 have a pair of piezoresistive parts 631, 641 provided at outer edge parts of the diaphragm 54, connection parts 632, 642 connecting the pair of piezoresistive parts 631, 641 together, and wirings 633, 643 connected to the other end parts of the pair of piezoresistive parts 631, 641.

The piezoresistive parts 611, 621, 631, 641 are each formed, for example, by doping (diffusing or injecting) impurities such as phosphorus or boron into the first Si layer 511 of the semiconductor substrate 51. The wirings 613, 623, 633, 643 and the connection parts 632, 642 are each formed, for example, by doping (diffusing or injecting) impurities such as phosphorus or boron into the first Si layer 511 at a higher density than in the piezoresistive parts 611, 621, 631, 641.

The piezoresistive elements 61, 62, 63, 64 are configured in such a way as to have an equal resistance value to each other in a natural state. The piezoresistive elements 61, 62, 63, 64 are electrically connected to each other via the wirings 613, 623, 633, 643 or the like, and form a bridge circuit (wheatstone bridge circuit) 60, as shown in FIG. 5, which is connected to the semiconductor circuit 9. A drive circuit (not shown) for supplying a drive voltage AVDC is connected to the bridge circuit 60. The bridge circuit 60 outputs a signal ($V_{OUT}$) corresponding to the resistance value of the piezoresistive elements 61, 62, 63, 64.

As shown in FIG. 3, the element peripheral structure 7 is formed so as to demarcate the cavity section 8. The element peripheral structure 7 has an interlayer insulating film 71, a wiring layer 72 formed on the interlayer insulating film 71, an interlayer insulating film 73 formed on the wiring layer 72 and the interlayer insulating film 71, a wiring layer 74 formed on the interlayer insulating film 73, a surface protection film 75 formed on the wiring layer 74 and the interlayer insulating film 73, and a sealing layer 76. The wiring layer 74 has a coating layer 741 having a plurality of narrow holes 742 communicating the inside and outside of the cavity section 8. The sealing layer 76 arranged on the coating layer 741 seals the narrow holes 742. The wiring layers 72, 74 include wiring layers 72a, 74a formed so as to surround the cavity section 8, and wiring layers 72b, 74b forming the wirings on the semiconductor circuit 9. Therefore, the semiconductor circuit 9 is drawn out onto the top surface of the physical quantity sensor 1 by the wiring layers 72b, 74b, and a part of the wiring layer 74b is the connection terminal 74b'.

As the interlayer insulating films 71, 73, though not particularly limited, for example, an insulating film such as a silicon oxide film ($SiO_2$ film) can be used. As the wiring layers 72, 74, though not particularly limited, for example, a metal film such as an aluminum film can be used. As the sealing layer 76, though not particularly limited, a metal film of Al, Cu, W, Ti, TiN or the like can be used. As the surface protection film 75, though not particularly limited, a resistant film for protecting the elements from moisture, dust, scratches or the like, such as a silicon oxide film, silicon nitride film, polyimide film, or epoxy resin film, can be used.

The cavity section 8 demarcated by the substrate 5 and the element peripheral structure 7 is a sealed space and functions as a pressure reference chamber that provides a reference value of the pressure detected by the sensor chip 3. The cavity section 8 is arranged overlapping with the diaphragm 54, and the diaphragm 54 forms apart of a wall section that demarcates the cavity section 8. The state inside the cavity section 8 is not particularly limited, but may preferably be a vacuum state (for example, 10 Pa or below). Thus, the sensor chip 3 can be used as a so-called "absolute pressure sensor element" which detects pressure on the basis of the vacuum state as a reference. However, the state inside the cavity section 8 may not be the vacuum state and may be, for example, an atmospheric state, a reduced-pressure state with a lower air pressure than the atmospheric pressure, or a pressurized state with a higher air pressure than the atmospheric pressure. Also, an inert gas such as a nitrogen gas or rare gas may be enclosed in the cavity section 8.

In the sensor chip 3 with such a configuration, the diaphragm 54 deforms according to the pressure received by the pressure receiving surface 541 of the diaphragm 54. This causes the piezoresistive elements 61, 62, 63, 64 to flex, and the resistance value of the piezoresistive elements 61, 62, 63, 64 changes according to the amount of flexure. The output from the bridge circuit 60 formed by the piezoresistive elements 61, 62, 63, 64 changes accordingly, and the magnitude of the pressure (absolute pressure) received by the pressure receiving surface 541 can be found on the basis of this output.

In the sensor chip 3, since the cavity section 8 and the semiconductor circuit 9 are provided on the same side of the substrate 5, the element peripheral structure 7 forming the cavity section 8 does not protrude from the side opposite to the semiconductor circuit 9 on the substrate 5 and therefore the height can be reduced. Moreover, the element peripheral structure 7 is formed by the same deposition as at least one of the interlayer insulating films 71, 73 and the wiring layers 72, 74. Thus, the element peripheral structure 7 can be formed simultaneously with the semiconductor circuit 9, using a CMOS process. Therefore, the manufacturing process of the sensor chip 3 is simplified and consequently the cost of the sensor chip 3 can be reduced. Even in the case where the cavity section 8 is sealed as in this embodiment, the cavity section 8 can be sealed by using a deposition method and there is no need to bond substrates together to seal a cavity as in the related-art technique. Again, in this regard, the manufacturing process of the sensor chip 3 is simplified and consequently the cost of the sensor chip 3 can be reduced.

IC Chip

The IC chip 4 has, for example, the function of calculating the magnitude of the pressure applied to the sensor chip 3, on the basis of an electrical signal generated in the sensor chip 3.

As shown in FIGS. 1 and 2, the IC chip 4 is in the shape of a plate and has a smaller quadrilateral shape than the sensor chip 3, as viewed in a plan view. The IC chip 4 is provided above and spaced apart from the sensor chip 3, overlapping with the sensor chip 3. As viewed in a plan view, the IC chip 4 is included in the sensor chip 3 with the connection terminal 74b' exposed outside. Since the IC chip 4 is thus arranged overlapping (vertically overlapping) with the sensor chip 3 as viewed in a plan view, the dimension in the direction of width of the physical quantity sensor 1 can be reduced and miniaturization of the physical quantity sensor 1 can be achieved.

As shown in FIG. 6, the IC chip 4 is a multilayer wiring board. An insulating film 42 made up of a silicon oxide film ($SiO_2$ film) is stacked on a semiconductor substrate 41 made up of a semiconductor such as silicon, and a semiconductor circuit (circuit) 40 for detecting the magnitude of the received pressure, for example, on the basis of a signal obtained from the bridge circuit 60, is built in on and above the semiconductor substrate 41. To protect the semiconductor circuit 40, a surface protection film (passivation film) 43 is stacked on the insulating film 42. As the surface protection film 43, though not particularly limited, a resistant film for protecting the elements from moisture, dust, scratches or the like, such as a silicon oxide film, silicon nitride film, polyimide film, or epoxy resin film, can be used. A part of the surface protection film 43 is eliminated and four connection terminals (connection parts) 410 provided in the semiconductor circuit 40 are exposed from the eliminated part.

On the semiconductor circuit 40, for example, a drive circuit (not shown) for driving the sensor chip 3, a temperature compensation circuit (not shown) for performing temperature compensation on the output from the bridge circuit 60 on the basis of the temperature detected by a temperature sensor, and the like are formed.

Wires

The sensor chip 3 and the IC chip 4 are each electrically connected to the wiring 24 provided on the flexible wiring board 25. Specifically, as shown in FIG. 2, the connection terminal 74b' provided on the sensor chip 3 is connected to the terminal 242 via the electrically conductive bonding wire 81. Thus, the sensor chip 3 is arranged in the way of being suspended from the wiring part 241 by the bonding wire 81 and is also electrically connected to the wiring part 241 via the bonding wire 81. Meanwhile, the connection terminal 410 provided on the IC chip 4 is connected to the terminal 246 via the electrically conductive bonding wire 82. Thus, the IC chip 4 is arranged in the way of being suspended from the wiring part 245 by the bonding wire 82 and is also electrically connected to the wiring part 245 via the bonding wire 82.

The entire structure made up of the sensor chip 3 and the IC chip 4 connected (arranged) in this way is not fixed to the inner walls of the package 2 and is moored inside the internal space 28 by the bonding wire 81, 82, as shown in FIG. 1. That is, with the bonding wires 81, 82, the sensor chip 3 and the IC chip 4 remain inside the internal space 28. Moreover, the structure is supported substantially horizontally with respect to the base 21, in the internal space 28, without contacting any other parts than the bonding wires 81, 82 and in a non-contact state with the package 2.

The structure may be in contact with the inner walls of the package 2 as long as the structure is not fixed thereto.

In this way, in the physical quantity sensor 1, since the sensor chip and the IC chip are moored inside the internal space 28 instead of being bonded to the base of the package via an adhesive as in the related-art technique, the propagation of a stress to the sensor chip 3 and the IC chip 4 due to a strain generated in the package 2 can be reduced. Therefore, deterioration in the detection performance of the sensor chip 3 and the IC chip 4 can be reduced and deterioration in the detection accuracy of the physical quantity sensor 1 can be reduced.

Also, in the physical quantity sensor 1, the sensor chip 3 and the IC chip 4 are electrically connected to each other between the wiring part 241 and the wiring part 245, and the sensor chip 3 and the IC chip 4 are independent of each other instead of being directly bonded together, for example, via a bump or the like. Therefore, the transmission of a stress between the sensor chip 3 and the IC chip 4 can be restrained as well.

The bonding wires 81, 82 have a certain degree of rigidity, have a relatively narrow elongate shape, and also have a portion flexing in a curved shape, thus having proper elasticity (pliability). Since the bonding wires 81, 82 have proper rigidity, the bonding wires 81, 82 can support the sensor chip 3 and the IC chip 4 so that an unwanted positional shift will not occur, for example, even if oscillation or the like is applied to the physical quantity sensor 1. Moreover, since the bonding wires 81, 82 have proper elasticity, the bonding wires 81, 82 can absorb a stress due to a strain generated in the package 2. Therefore, deterioration in the detection performance of the sensor chip 3 and the IC chip 4 can be restrained further.

In this embodiment, the physical quantity sensor 1 has four bonding wires 81 and the respective bonding wires 81 are provided near the four corner parts of the sensor chip 3, as shown in FIG. 2. As the respective bonding wires 81 are thus arranged symmetrically with each other, the sensor chip 3 can be easily supported substantially horizontally with respect to the base 21, in a non-contact state with the inner walls of the package 2. The same can be applied to the IC chip 4.

The substrate 23 provided with the terminals 242, 246 to which the bonding wires 81, 82 are connected has pliability (flexibility) as described above. Therefore, the substrate 23 can further absorb the stress generated by the strain in the package 2. Thus, since the stress generated by the strain in the package 2 can be absorbed by the substrate 23 (flexible wiring board 25) as well as the bonding wires 81, 82, the propagation of the stress to the sensor chip 3 and the IC chip 4 can be reduced further.

The bonding wires 81, 82 may preferably have a thickness of 0.1 μm or above and 50 μm or below, for example, and more preferably 1 μm or above and 30 μm or below. Thus, the bonding wires 81, 82 can have both proper rigidity and pliability.

The material for forming the bonding wires 81, 82 is not particularly limited. Various metal materials such as gold, aluminum and copper can be used.

Filler

As shown in FIG. 1, the filler 11 is placed to fill the internal space 28 formed in the package 2 and provided in the way of surrounding the sensor chip 3 and the IC chip 4 accommodated inside the internal space 28. Also, the filler 11 is provided in contact with the pressure receiving surface 541 and the bonding wires 81, 82.

Such a filler 11 provides protects (dustproof and waterproof) the sensor chip 3 and the IC chip 4, and also functions as a pressure propagation medium which propagates the pressure applied to the physical quantity sensor 1, to the pressure receiving surface 541 of the sensor chip 3 via the opening of the package 2. Since the filler 11 functioning as the pressure propagation medium is connected to the pressure receiving surface 541 of the sensor chip 3, the pressure applied to the physical quantity sensor 1 efficiently acts on the pressure receiving surface 541 of the sensor chip 3 via the opening of the housing 22 and the filler 11.

The filler 11 is made up of, for example, a substance having a softer characteristic (pliability) than the sensor chip 3, the IC chip 4 and the package 2. Thus, the filler 11 can absorb a strain in the package 2 and therefore the propagation of a stress to the sensor chip 3 and the IC chip 4 due to the strain can be reduced further.

The filler 11 is, for example, liquid or gel-type. Particularly by using the gel-type filler 11, it is possible to reduce the fluctuation in the position of the sensor chip 3 within the internal space 28 and therefore perform highly accurate detection without being influenced by a change in the posture of the physical quantity sensor 1. If the filler 11 is gel-type, the penetration of the filler 11 may be preferably in a range of 50 or above and 250 or below, and more preferably in a range of 150 or above and 250 or below. Thus, the filler 11 can be made sufficiently soft. The pressure applied to the physical quantity sensor 1 can be made to act efficiently on the pressure receiving surface 541 of the sensor chip 3 via the opening of the housing 22 and the filler 11, and the influence of the strain in the package 2 on the sensor chip 3 and the IC chip 4 can be restrained further. Also, the fluctuation in the position of the sensor chip 3 within the internal space 28 can be reduced further.

The filler 11 contains a pliable (soft) resin. Since the filler 11 contains the pliable (soft) resin, a gel-type filler 11 can be obtained easily.

Also, the filler 11 is made up of an insulative material. Therefore, even if the filler 11 made up of the insulative material is connected to the bonding wires 81, 82 as described above, a short circuit between the bonding wire 81 and the bonding wire 82 can be prevented further.

The specific gravity of the filler 11 may be preferably as close to the specific gravities of the sensor chip 3 and the IC chip 4 as possible. Thus, even if the posture of the physical quantity sensor 1 is changed, the fluctuation in the positions of the sensor chip 3 and the IC chip 4 within the internal space 28 can be reduced.

As a specific material for forming the filler 11, for example, a fluorine-based resin and a silicone resin or the like can be used. Of these, one type or a combination of two types or more can be used. Thus, the filler 11 is made sufficiently soft and can efficiently propagate the pressure applied to the physical quantity sensor 1, to the pressure receiving surface 541.

Second Embodiment

Figure 7:
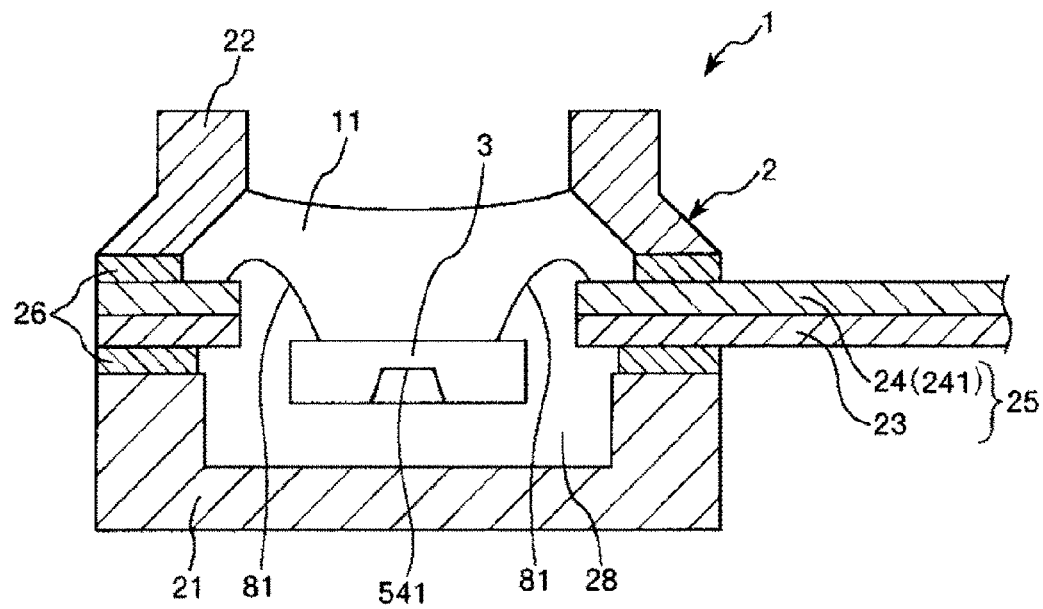
FIG. 7 is a cross-sectional view showing a second embodiment of the physical quantity sensor according to the invention.
Figure 8:
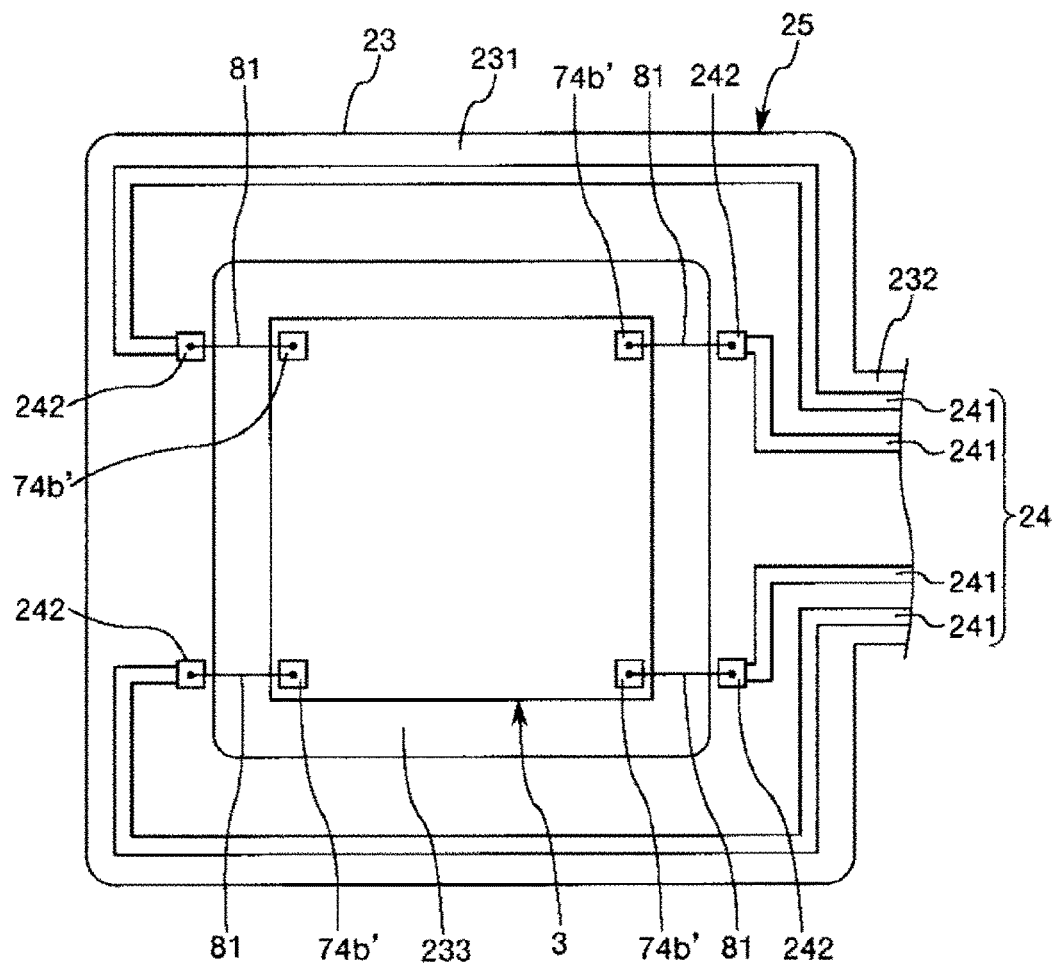
FIG. 8 is a plan view of the physical quantity sensor shown in FIG. 7.

Next, a second embodiment of the physical quantity sensor (electronic device) according to the invention will be described. FIG. 7 is a cross-sectional view showing the second embodiment of the physical quantity sensor according to the invention. FIG. 8 is a plan view of the physical quantity sensor shown in FIG. 7. In FIG. 8, the illustration of the housing 22 is omitted as a matter of convenience for explanation. Hereinafter, the second embodiment of the physical quantity sensor will be described, mainly in terms of the differences from the above embodiment and omitting the description of similar features.

The physical quantity sensor (electronic device) 1 according to the second embodiment is similar to the first embodiment, except that the IC chip 4 is omitted and that the sensor chip 3 and the wiring 24 have difference configurations.

In the physical quantity sensor 1 shown in FIG. 7, the semiconductor circuit (IC circuit) 9 provided in the sensor chip 3 calculates the magnitude of the pressure applied to the sensor chip 3 on the basis of an electrical signal generated in the sensor element 6, similarly to the IC chip 4 provided in the physical quantity sensor 1 of the first embodiment. That is, in this embodiment, the sensor chip and the IC chip are integrated together and the IC chip 4 is omitted. Thus, a further reduction in size and height can be achieved.

In the physical quantity sensor 1 according to this embodiment, the wiring 24 has four wiring parts 241, as shown in FIG. 8, whereas the wiring parts 245 are omitted, compared with the first embodiment. The wiring parts 241 are electrically connected to the sensor chip 3 as the connection terminals 74b' are connected to the terminals 242 via the bonding wires 81.

The second embodiment can achieve similar effects to the first embodiment.

Third Embodiment

Figure 9:
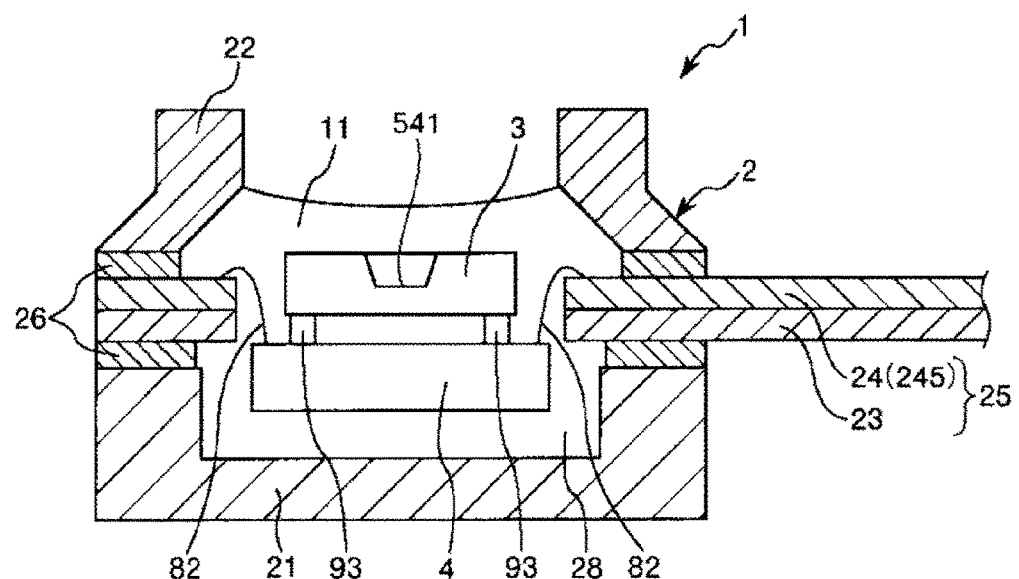
FIG. 9 is a cross-sectional view showing a third embodiment of the physical quantity sensor according to the invention.
Figure 10:
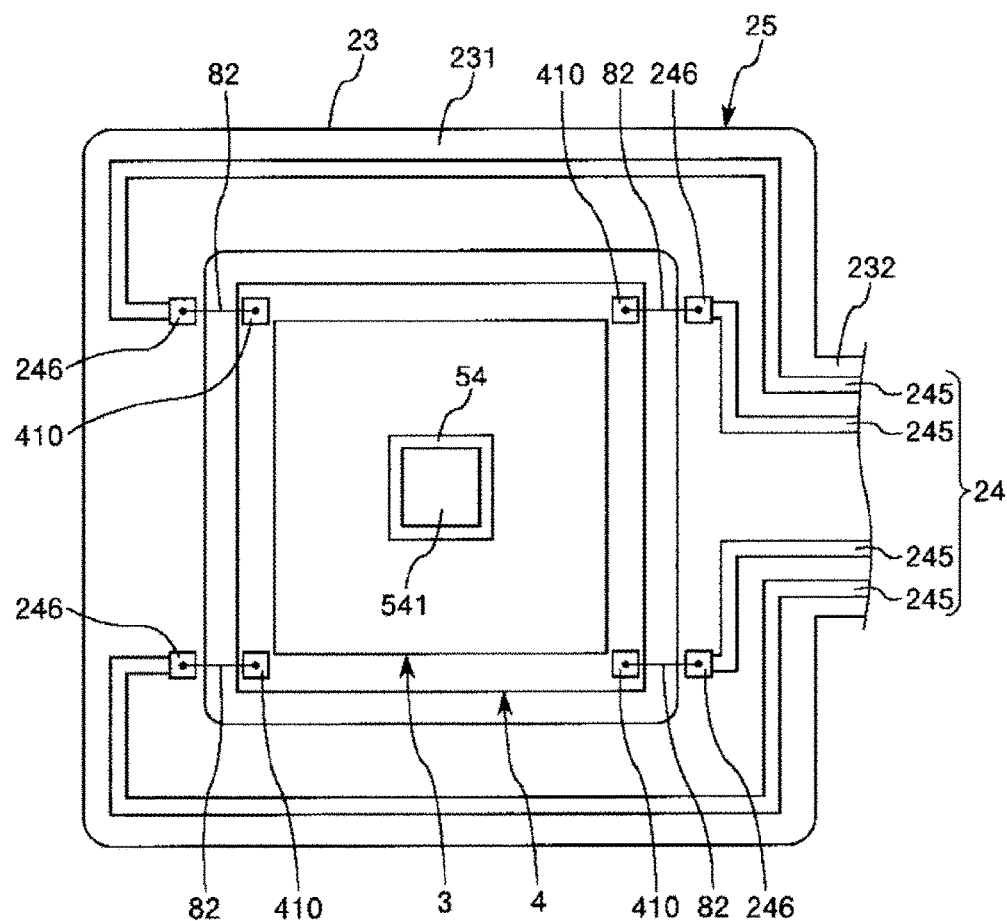
FIG. 10 is a plan view of the physical quantity sensor shown in FIG. 9.
Figure 11:
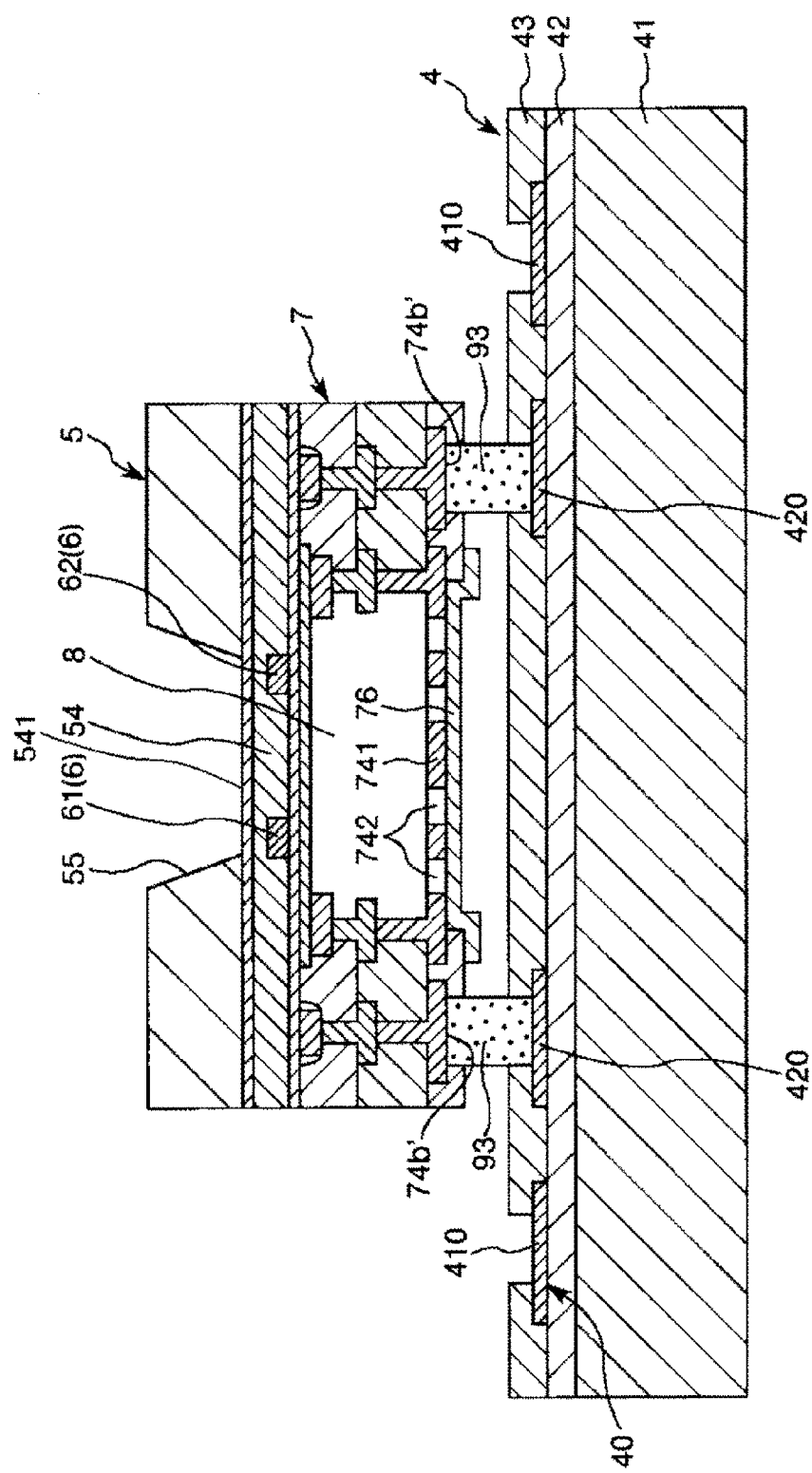
FIG. 11 is a cross-sectional view showing an IC chip and a physical quantity sensor chip provided in the physical quantity sensor shown in FIG. 9.

Next, a third embodiment of the physical quantity sensor (electronic device) according to the invention will be described. FIG. 9 is a cross-sectional view showing the third embodiment of the physical quantity sensor according to the invention. FIG. 10 is a plan view of the physical quantity sensor shown in FIG. 9. FIG. 11 is a cross-sectional view showing an IC chip and a physical quantity sensor chip provided in the physical quantity sensor shown in FIG. 9. In FIG. 10, the illustration of the housing 22 is omitted as a matter of convenience for explanation. In the description below, the top side in FIGS. 9 and 11 is referred to as the "top" and the bottom side is referred to as the "bottom". Hereinafter, the third embodiment of the physical quantity sensor will be described, mainly in terms of the differences from the foregoing embodiment and omitting the description of similar features.

The physical quantity sensor (electronic device) 1 according to the third embodiment is similar to the first embodiment, except that the direction in which the sensor chip 3 faces and the form of connection between the sensor chip 3, the IC chip 4 and the wiring 24 are different.

In the physical quantity sensor 1 shown in FIG. 9, the sensor chip 3 is situated on the side of the opening of the package 2, and the IC chip 4 is situated on the side of the base 21. The sensor chip 3 is arranged in such a way that the pressure receiving surface 541 of the diaphragm 54 faces toward the top (that is, opposite to the IC chip 4), as shown in FIGS. 9 and 11. With this arrangement, the pressure receiving surface 541 can be directed toward the opening of the package 2 and brought closer to the opening of the package 2. Therefore, the pressure applied to the physical quantity sensor 1 acts efficiently on the pressure receiving surface 541. Thus, the pressure detection performance of the sensor chip 3 can be improved further.

As shown in FIG. 11, the IC chip 4 has a connection terminal (connection part) 420 which, as a part of the surface protection film 43 is eliminated, is exposed from the eliminated part. The connection terminal 420 is connected to the connection terminal 74b' provided on the sensor chip 3, via an electrically conductive fixing member 93. Thus, the IC chip 4 is electrically connected to the sensor chip 3. As the sensor chip 3 and the IC chip 4 are thus connected together via the fixing member 93, the relative positional relation between the sensor chip 3 and the IC chip 4 can be regulated, and therefore unintended contact between the sensor chip 3 and the IC chip 4 can be prevented. By assembling the sensor chip 3 and the IC chip 4 in advance, it is possible to facilitate the manufacture (assembly) of the physical quantity sensor 1. The fixing member 93 is not particularly limited as long as it is electrically conductive. For example, a metal brazing material such as solder, a metal bump such as gold bump, an electrically conductive adhesive, or the like, can be used.

As shown in FIG. 10, in the physical quantity sensor 1 of this embodiment, the wiring 24 has four wiring parts 245, whereas the wiring parts 241 are omitted, compared with the first embodiment. The wiring parts 245 are electrically connected to the IC chip 4 as the connection terminals 410 are connected to the terminals 246 via the bonding wires 82.

The third embodiment can achieve similar effects to the first embodiment.

Fourth Embodiment

Figure 12:
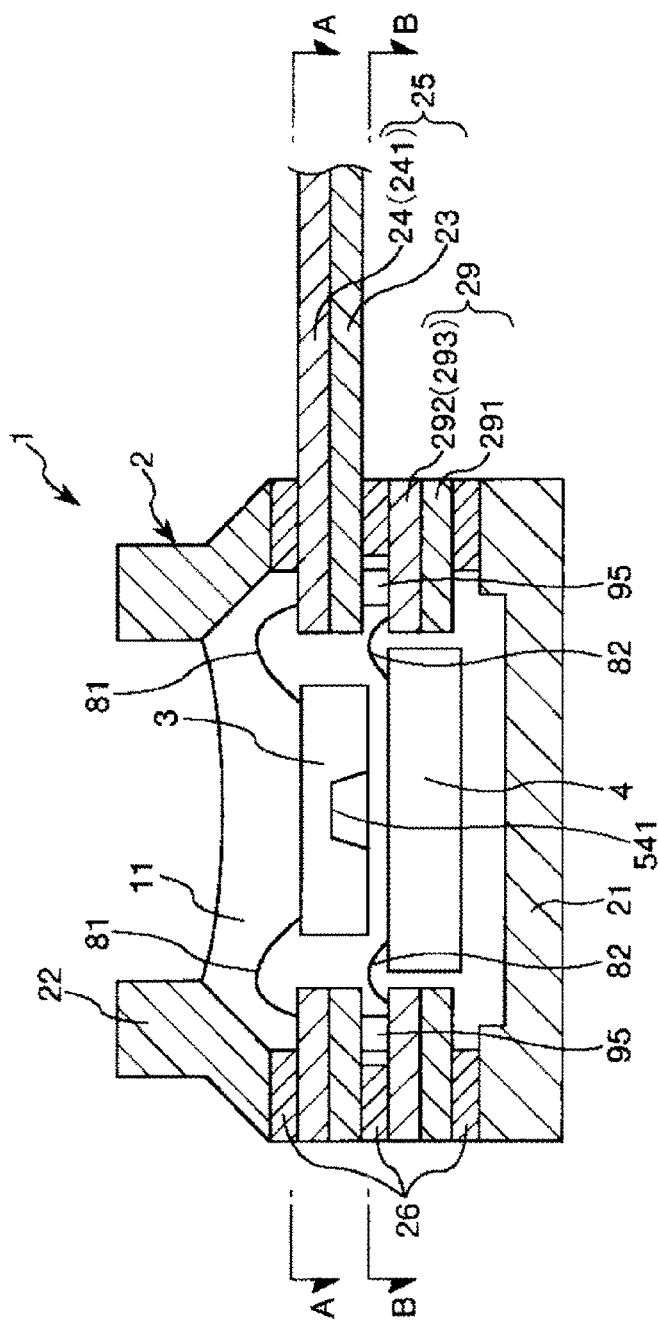
FIG. 12 is a cross-sectional view showing a fourth embodiment of the physical quantity sensor according to the invention.
Figure 13A:
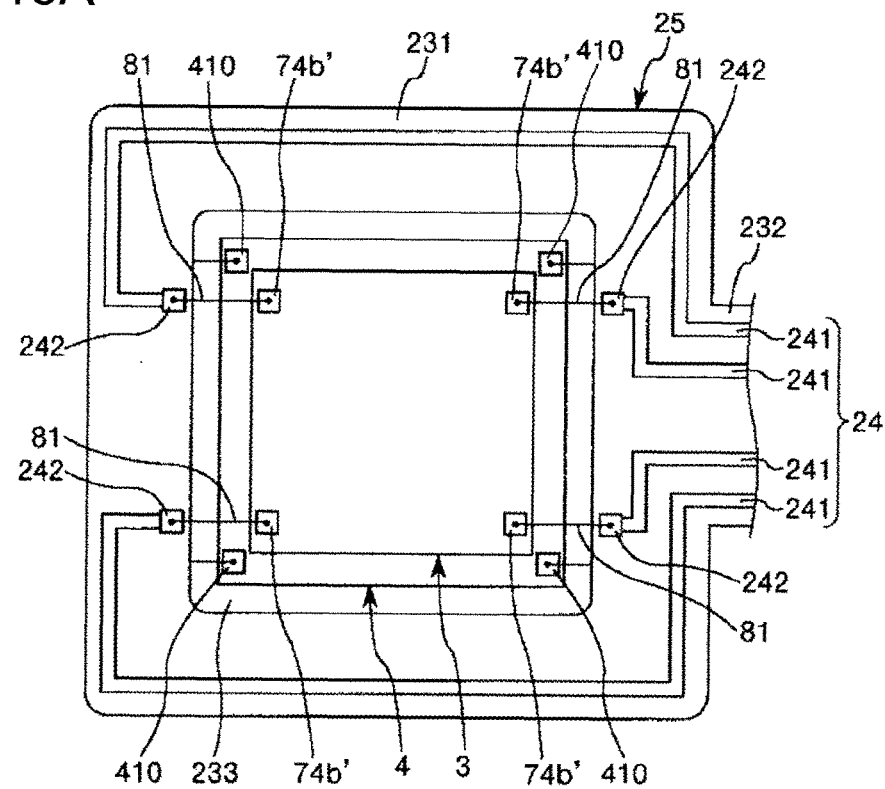
FIGS. 13A and 13B are plan views of the physical quantity sensor shown in FIG. 12.
Figure 13B:
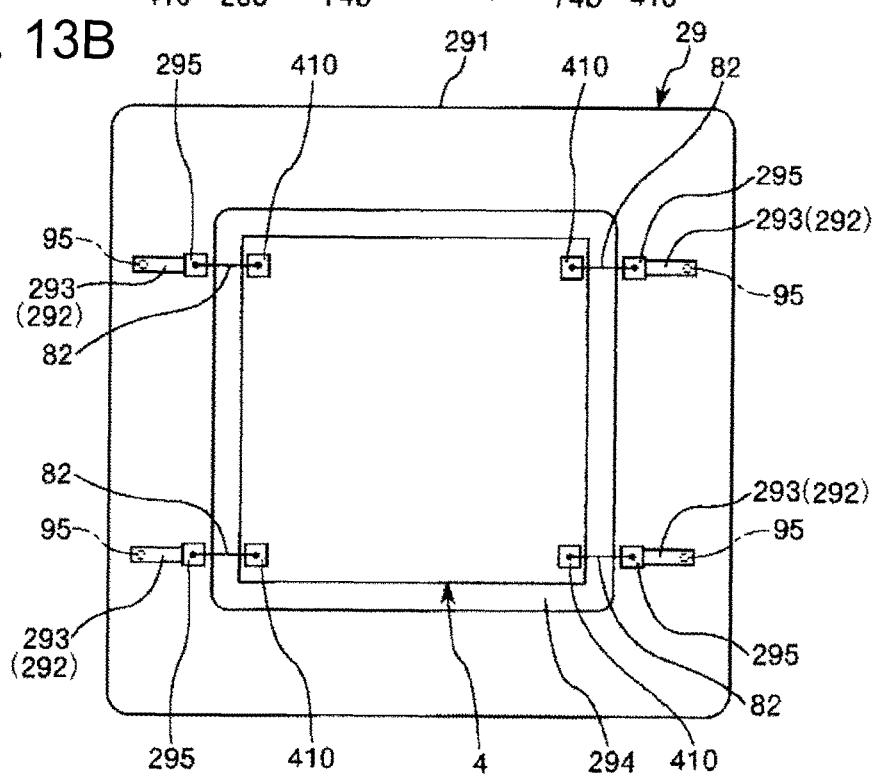

Next, a fourth embodiment of the physical quantity sensor (electronic device) according to the invention will be described. FIG. 12 is a cross-sectional view showing the fourth embodiment of the physical quantity sensor according to the invention. FIGS. 13A and 13B are plan views of the physical quantity sensor shown in FIG. 12. FIG. 13A shows a cross-sectional view taken along A-A in FIG. 12. FIG. 13B shows a cross-sectional view taken along B-B in FIG. 12. In the description below, the top side in FIG. 12 is referred to as the "top" and the bottom side is referred to as the "bottom". Hereinafter, the fourth embodiment of the physical quantity sensor will be described, mainly in terms of the differences from the foregoing embodiment and omitting the description of similar features.

The physical quantity sensor (electronic device) 1 according to the fourth embodiment is similar to the first embodiment, except that the configuration of the package 2 and the form of connection of the sensor chip 3 and the IC chip 4 are different.

In the physical quantity sensor 1 shown in FIG. 12, the package 2 further has a flexible wiring board 29 and is formed by having the base 21, the flexible wiring board 29, the flexible wiring board 25 and the housing 22 stacked in this order. The bonding between the base 21 and the flexible wiring board 29, the bonding between the flexible wiring board 29 and the flexible wiring board 25, and the bonding between the flexible wiring board 25 and the housing 22, are carried out respectively via the adhesive layer 26 made up of an adhesive.

The flexible wiring board 29 has the function of taking an electrical signal from the IC chip 4 out of the package 2 via the flexible wiring board 25. The flexible wiring board 29 is formed by a flexible substrate 291 and a wiring 292 formed on the top side of the substrate 291, as shown in FIG. 13B.

The substrate 291 is in the shape of a square frame, as viewed in a plan view, having an opening 294 at a center part, and is arranged in such a way that an inner edge part thereof protrudes into the internal space 28 along the entire circumference. The material for forming the substrate 291 is not particularly limited as long as it is flexible. Similar materials to the substrate 23 described in the first embodiment can be used.

The wiring 292 has four wiring parts 293. At the end parts of the wiring parts 293 on the side of the internal space 28, terminals 295 which electrically connect the connection terminals 410 of the IC chip 4 via the bonding wires 82 are provided. At the outer end parts of the wiring parts 293, electrically conductive adhesives 95 which electrically connect the IC chip 4 and the sensor chip 3 together are bonded.

In the physical quantity sensor 1 of this embodiment, the sensor chip 3 is situated on the top side above the IC chip 4 and arranged opposite the IC chip 4 in such a way that the pressure receiving surface 541 of the diaphragm 54 faces toward the bottom side (that is, toward the side of the IC chip 4), as shown in FIG. 12. As the sensor chip 3 is thus arranged, the pressure receiving surface 541 can be brought closer to the IC chip 4. Therefore, for example, if a temperature sensor, not shown, is provided on the IC chip 4, the temperature of the diaphragm 54 and hence the temperature of the piezoresistive elements 61 to 64 provided in the diaphragm 54 can be detected by the temperature sensor with higher accuracy. Thus, temperature control of the physical quantity sensor 1 can be carried out with higher accuracy.

Also, as shown in FIG. 13A, in the physical quantity sensor 1 of this embodiment, the wiring 24 provided on the flexible wiring board 25 has four wiring parts 241, whereas the wiring parts 245 are omitted, compared with the first embodiment. The wiring parts 241 electrically connected to the sensor chip 3 as the connection terminals 74b' are connected to the terminals 242 via the bonding wires 81. Meanwhile, the IC chip 4 is electrically connected to the wiring parts 293 provided on the flexible wiring board 29 as the connection terminals 410 are connected thereto via the bonding wires 82.

Since the bonding wires 81 supporting the sensor chip 3 and the bonding wires 82 supporting the IC chip 4 are connected to the different flexible wiring boards from each other, the transmission of a stress between the sensor chip 3 and the IC chip 4 can be reduced further. Therefore, deterioration in the detection performance of the sensor chip 3 and the IC chip 4 can be restrained further.

As shown in FIG. 12, the wiring part 293 and the wiring part 241 are connected together via the electrically conductive adhesive 95 and a through-electrode, not shown, penetrating through the substrate 23. Thus, the sensor chip 3 and the IC chip 4 are electrically connected together. The electrically conductive adhesive 95 is not particularly limited as long as it is electrically conductive and adhesive. For example, an electrically conductive adhesive made up of a resin material such as an epoxy-based, acrylic, or silicone-based resin, mixed with an electrically conductive material such as silver particles, or a metal bump such as a gold bump, silver bump, or copper bump can be used.

The fourth embodiment can achieve similar effects to the first embodiment.

Fifth Embodiment

Figure 14:
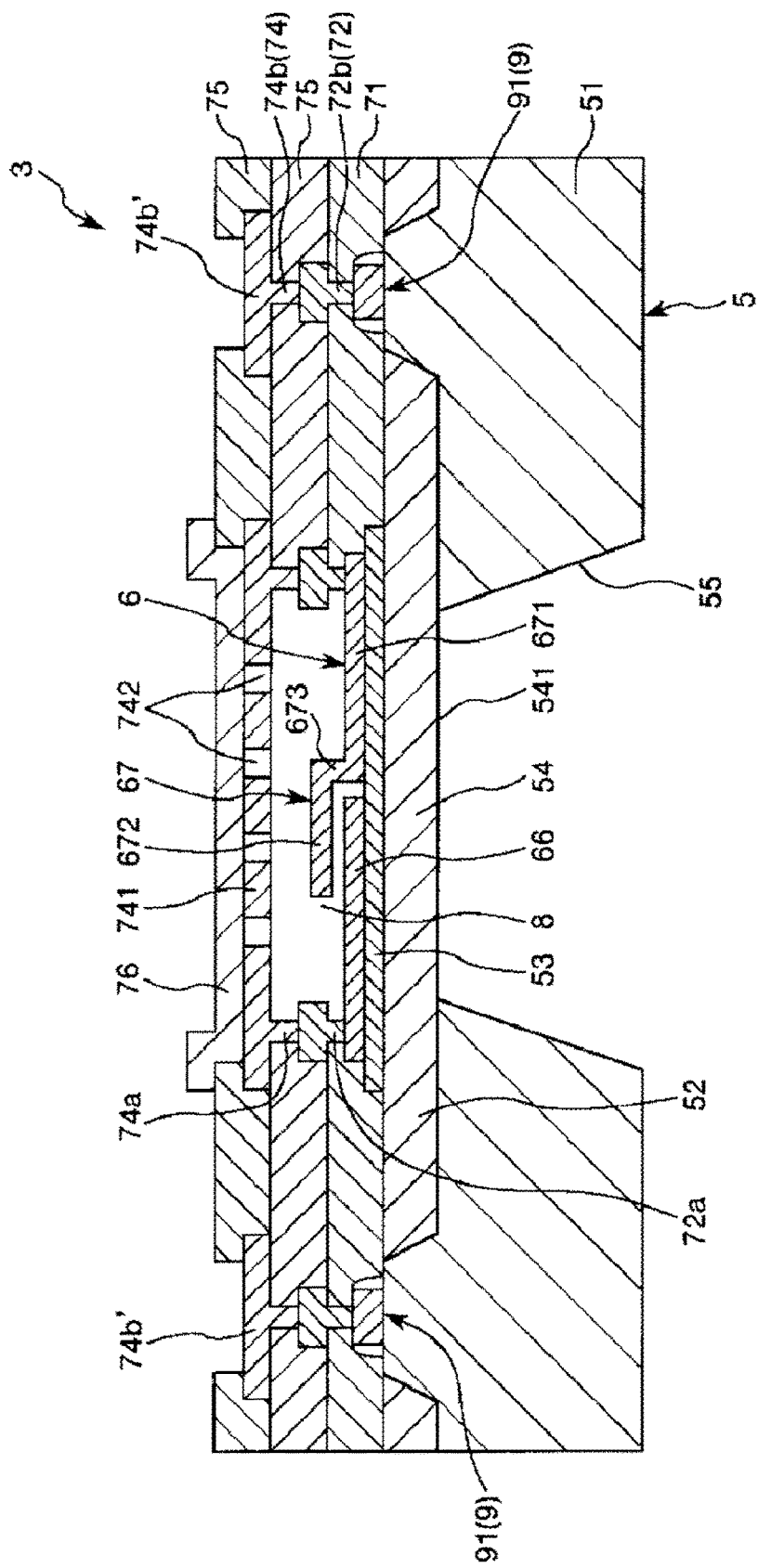
FIG. 14 is a cross-sectional view showing a physical quantity sensor chip provided in a physical quantity sensor according to a fifth embodiment.

Next, a fifth embodiment of the physical quantity sensor will be described. FIG. 14 is a cross-sectional view showing a physical quantity sensor chip provided in the fifth embodiment of the physical quantity sensor. Hereinafter, the fifth embodiment of the physical quantity sensor will be described, mainly in terms of the differences from the foregoing embodiment and omitting the description of similar features.

The fifth embodiment is similar to the first embodiment, except that the configuration of the sensor element provided on the sensor chip is different.

As shown in FIG. 14, the sensor element 6 of this embodiment has a fixed electrode 66 and a movable electrode 67 provided over the diaphragm 54. The movable electrode 67 has a support section 671 provided over the diaphragm 54, a movable section 672 arranged opposite and spaced apart from the fixed electrode 66, and an elastically deformable connecting section 673 which connects the support section 671 and the movable section 672 together. In the sensor chip 3 with such a configuration, the diaphragm 54 deforms according to the pressure received by the pressure receiving surface 541 of the diaphragm 54, and this causes the gap (spacing distance) between the movable section 672 and the fixed electrode 66 to change. As the gap changes, the resonance frequency of an oscillation system formed by the fixed electrode 66 and the movable electrode 67 changes. Therefore, based on the change in the resonance frequency, the magnitude of the pressure (absolute pressure) received by the pressure receiving surface 541 can be found.

The fifth embodiment can achieve similar effects to the first embodiment.

Sixth Embodiment

Figure 15:
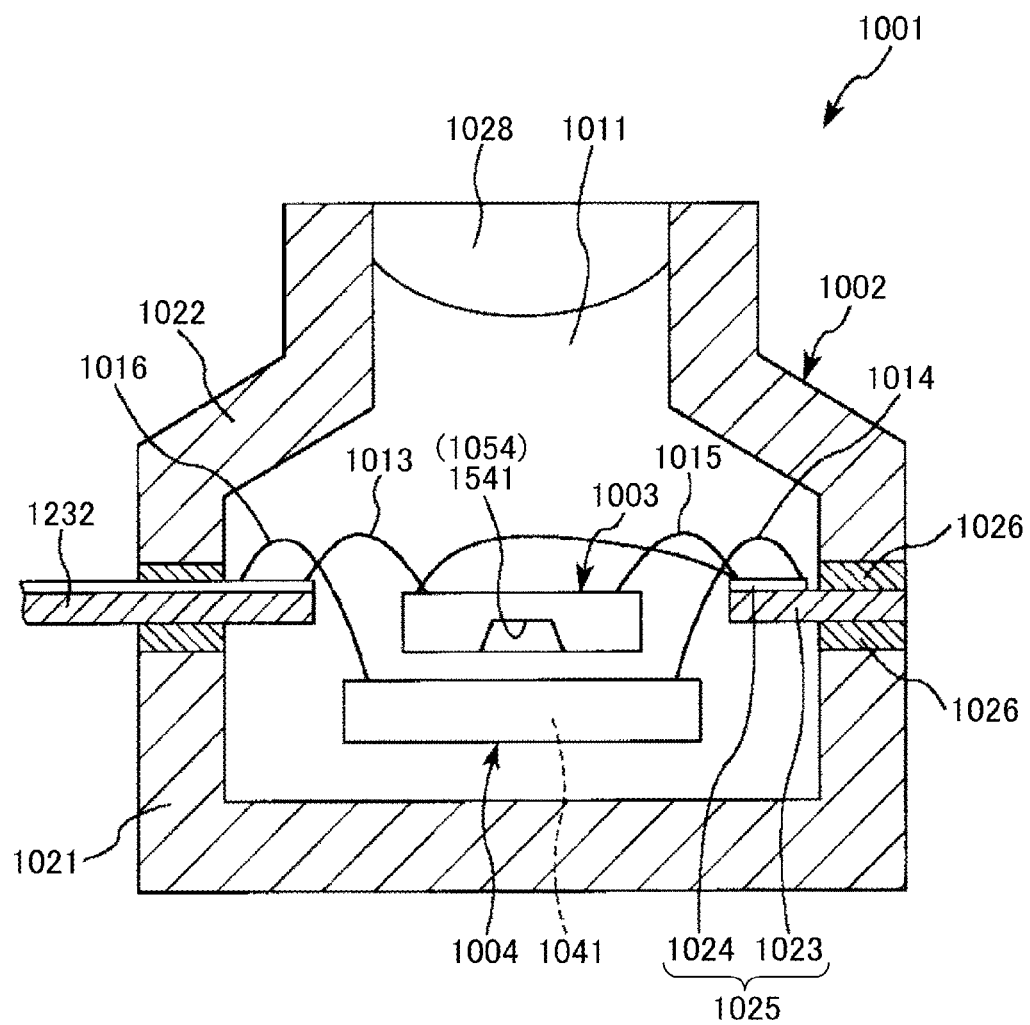
FIG. 15 is a cross-sectional view showing a physical quantity sensor as an electronic device according to a sixth embodiment of the invention.
Figure 16:
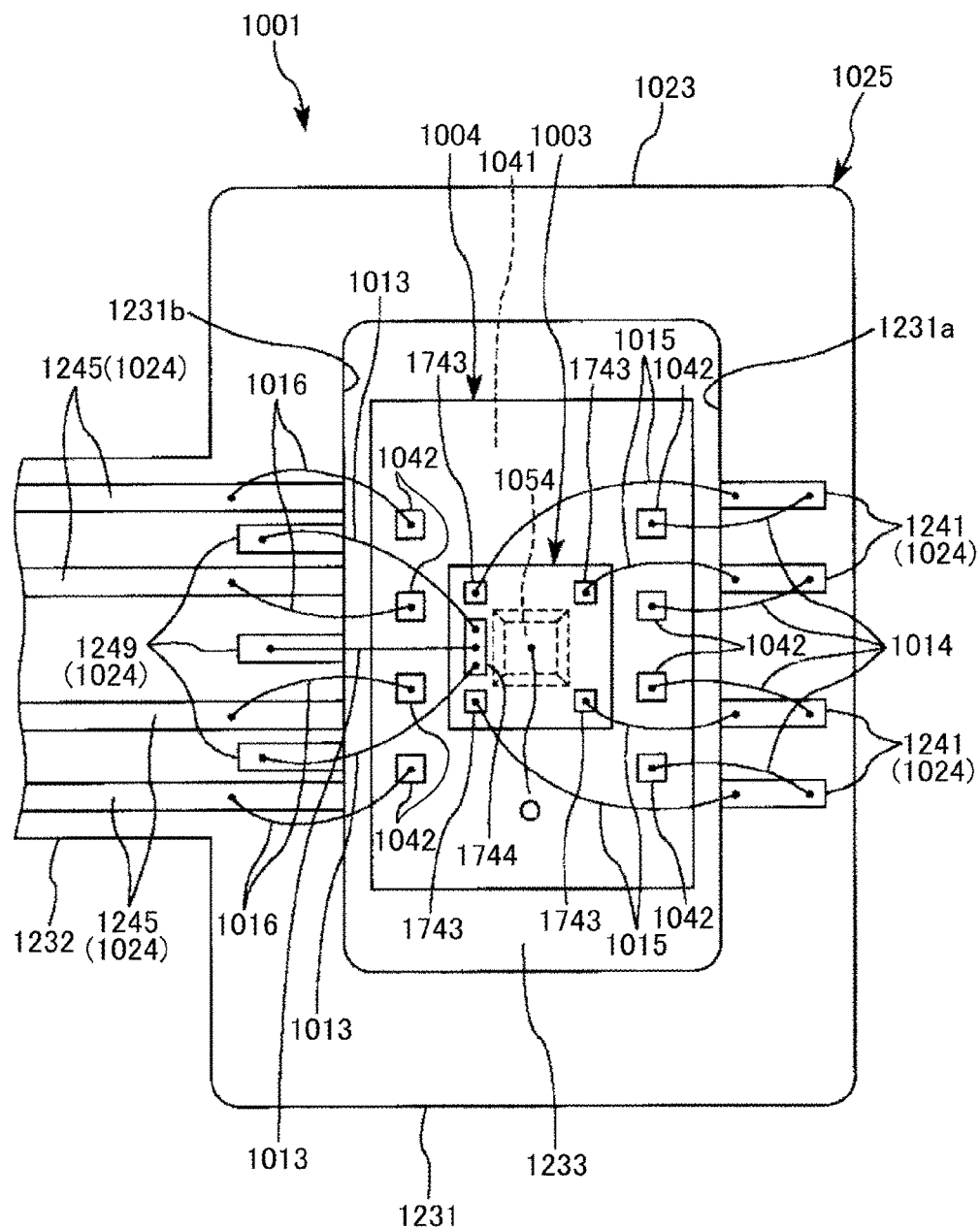
FIG. 16 is a plan view of the electronic device shown in FIG. 15.
Figure 17:
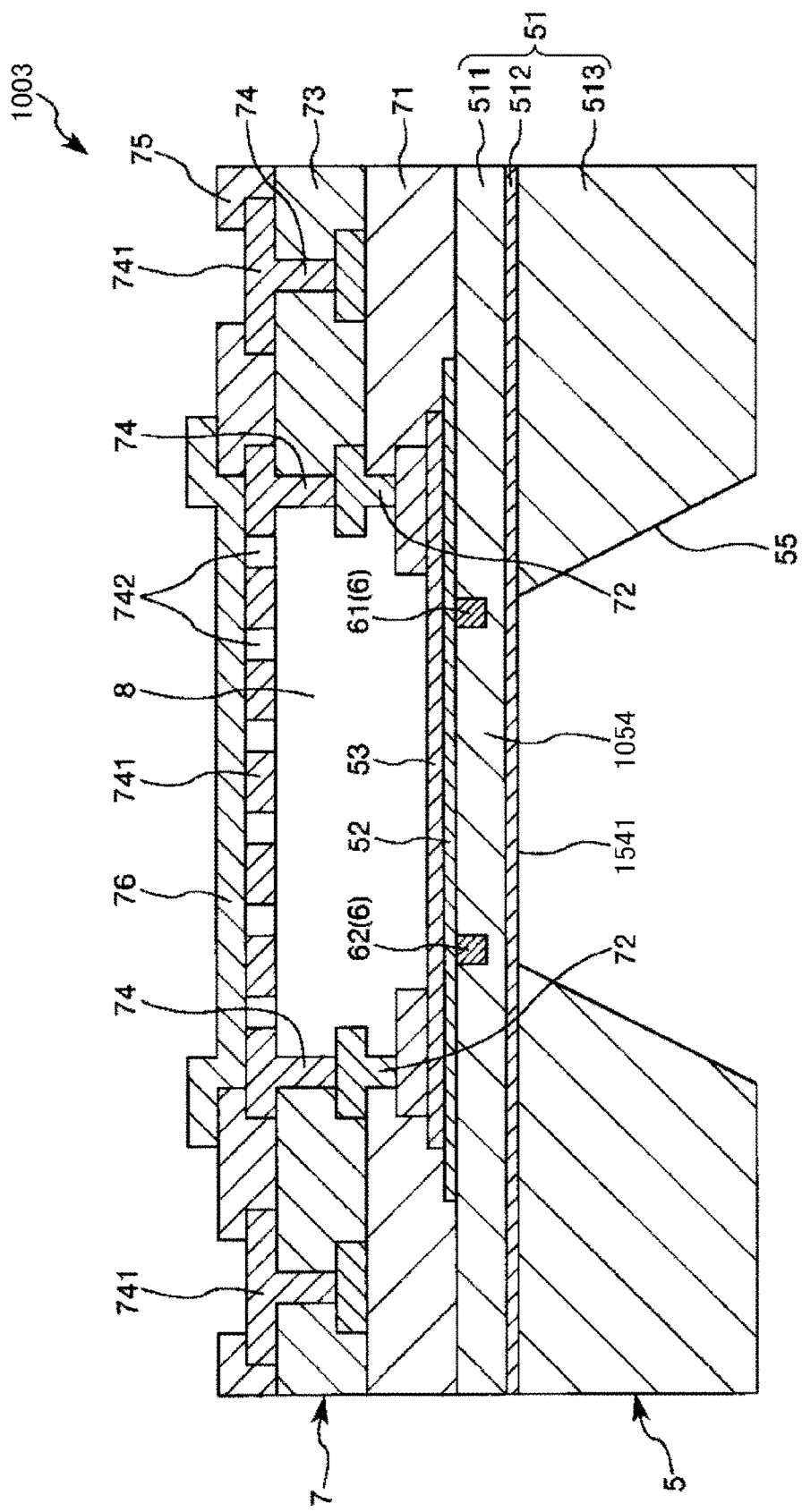
FIG. 17 is a cross-sectional view showing a pressure sensor element provided in the electronic device shown in FIG. 15.
Figure 18:
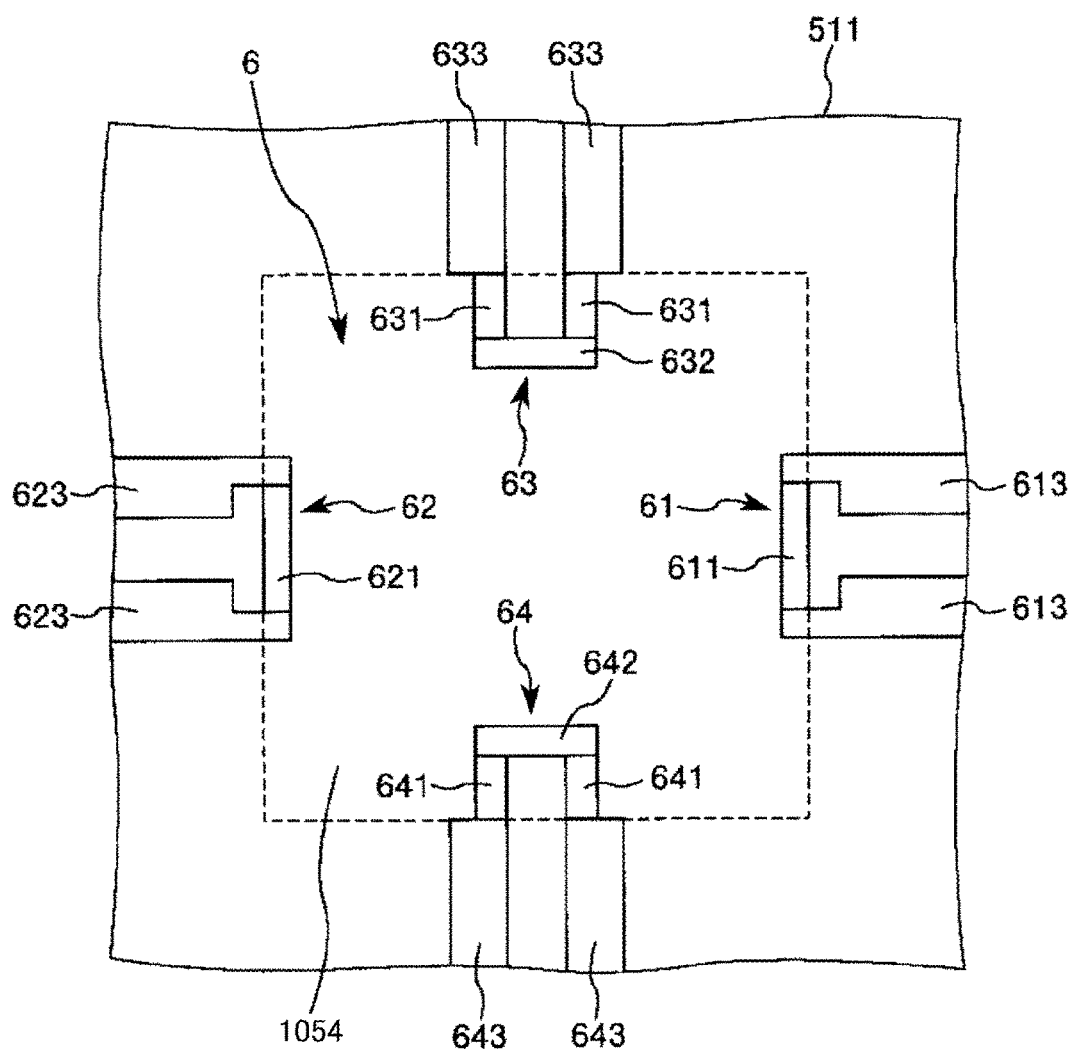
FIG. 18 is a plan view showing a pressure sensor section of the pressure sensor element shown in FIG. 17.
Figure 19:
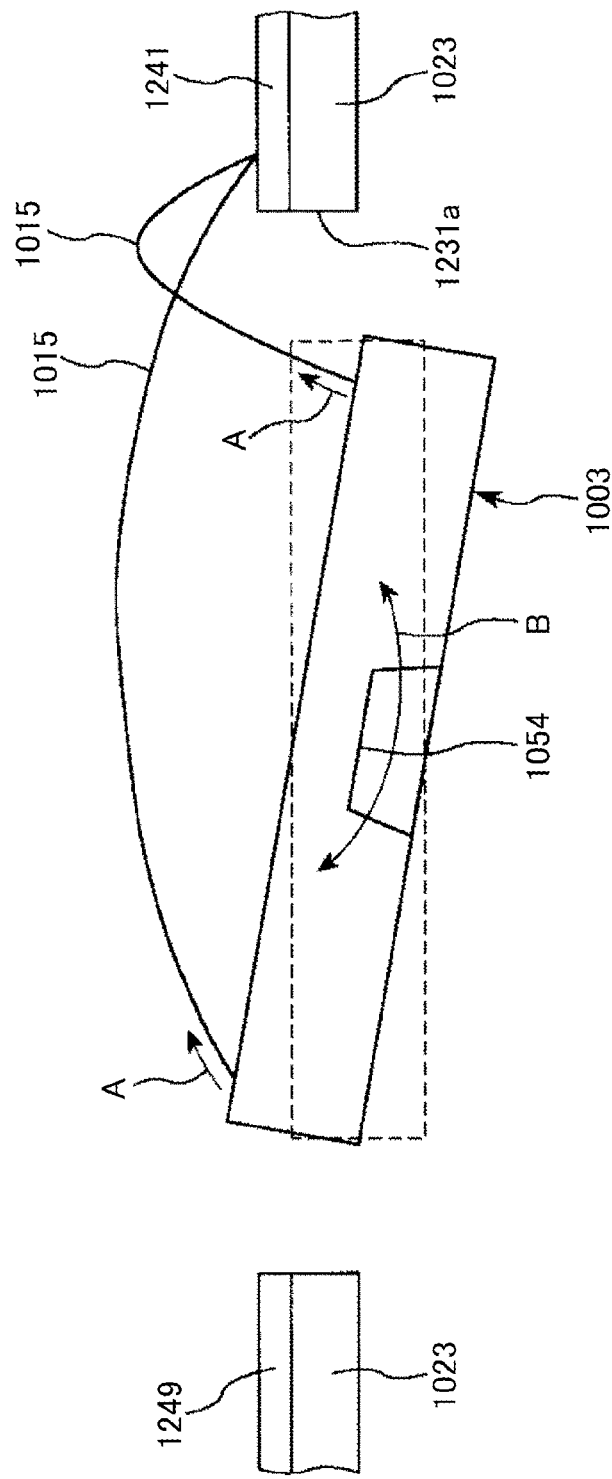
FIG. 19 explains the function of a second wire provided in the electronic device shown in FIG. 15.
Figure 20:
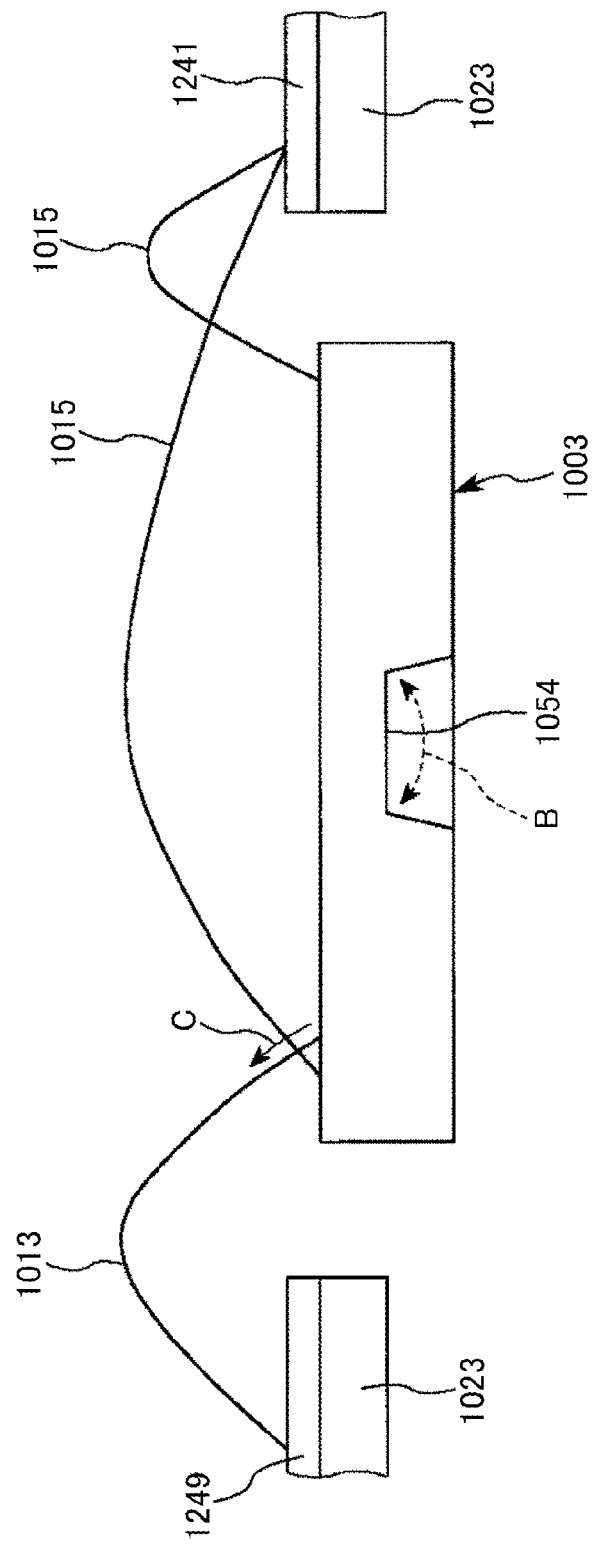
FIG. 20 explains the function of the second wire provided in the electronic device shown in FIG. 15.
Figure 21:
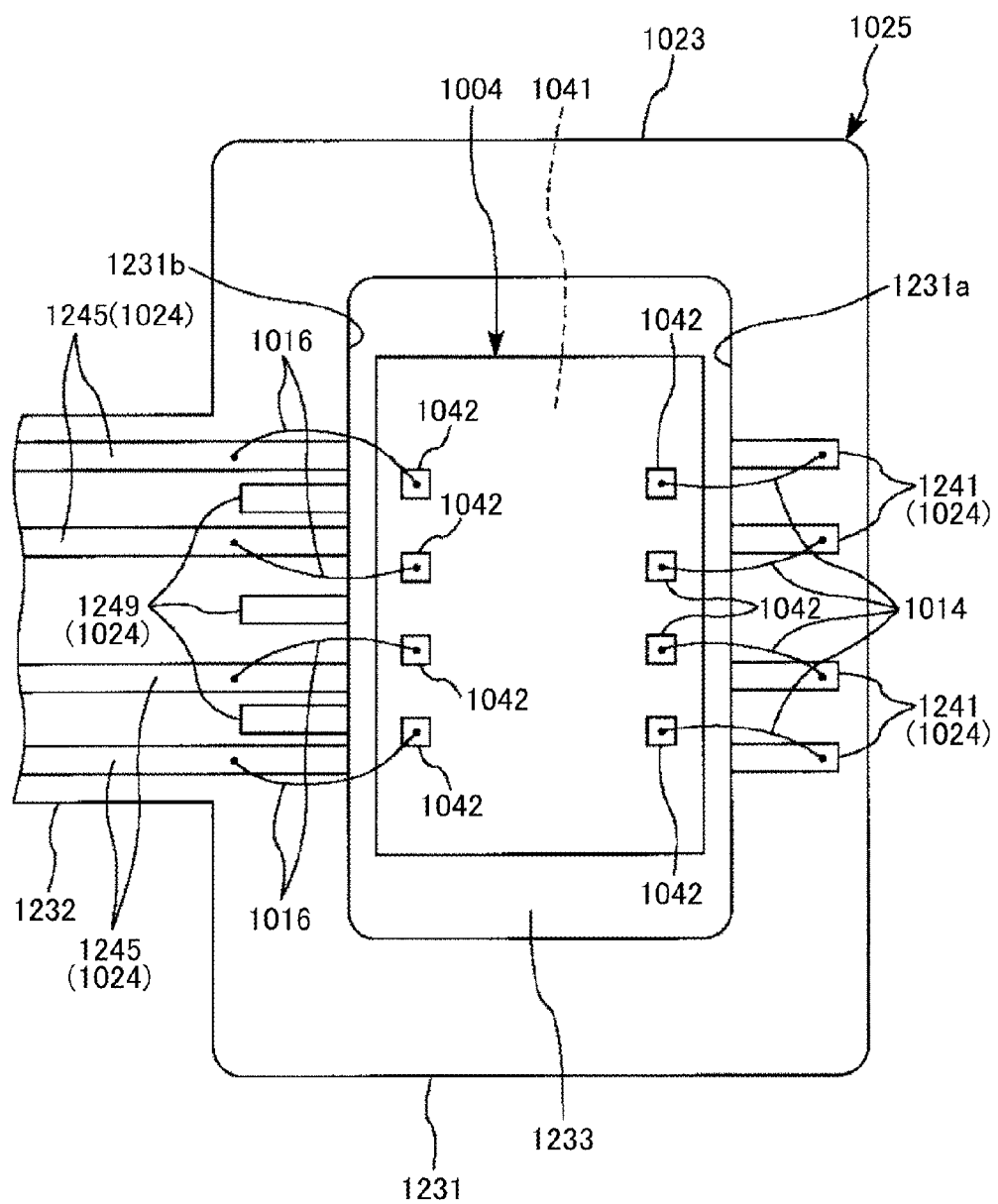
FIG. 21 is a plan view for explaining a method for manufacturing the electronic device shown in FIG. 15.
Figure 22:
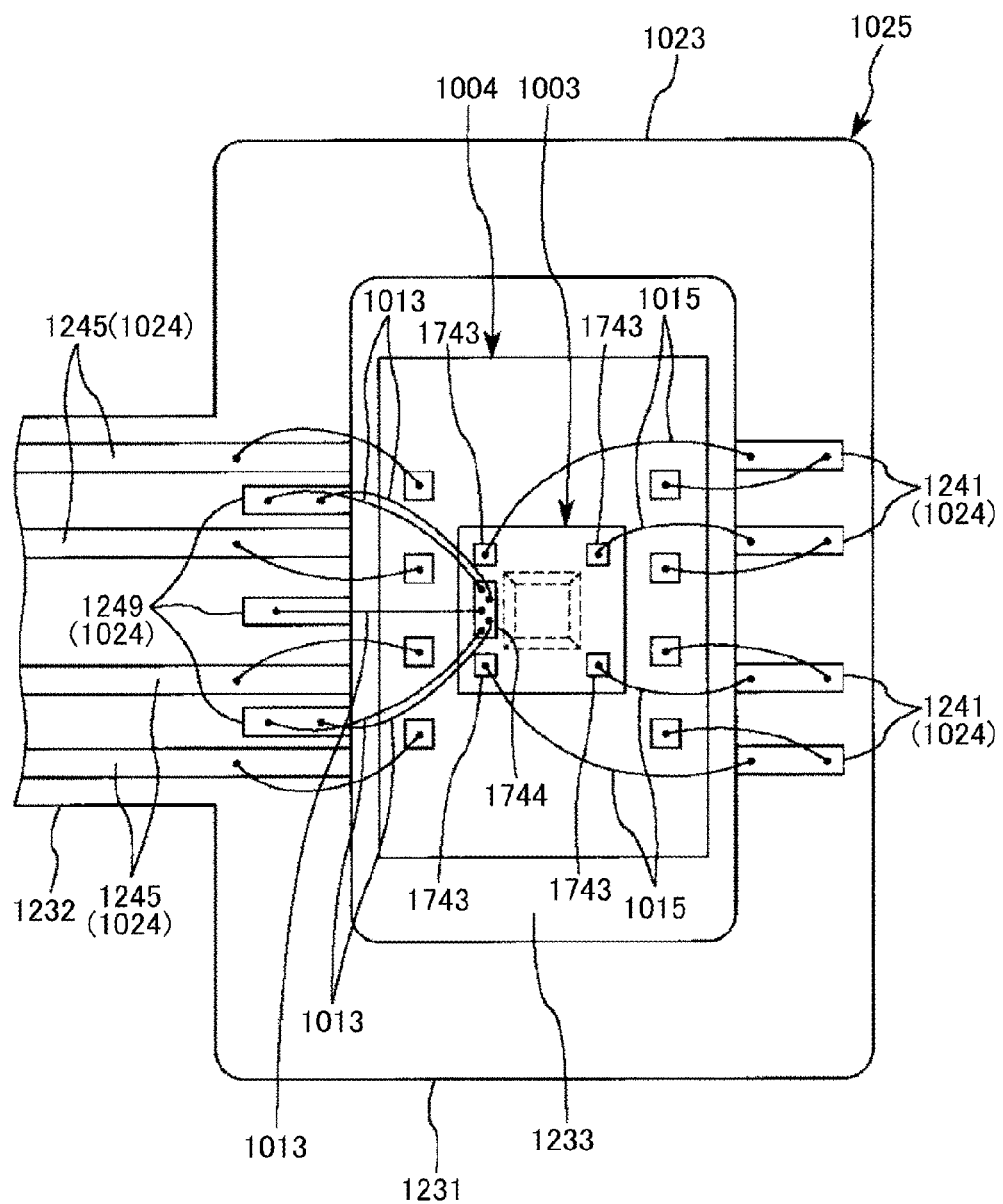
FIG. 22 is a plan view for explaining the method for manufacturing the electronic device shown in FIG. 15.
Figure 23:
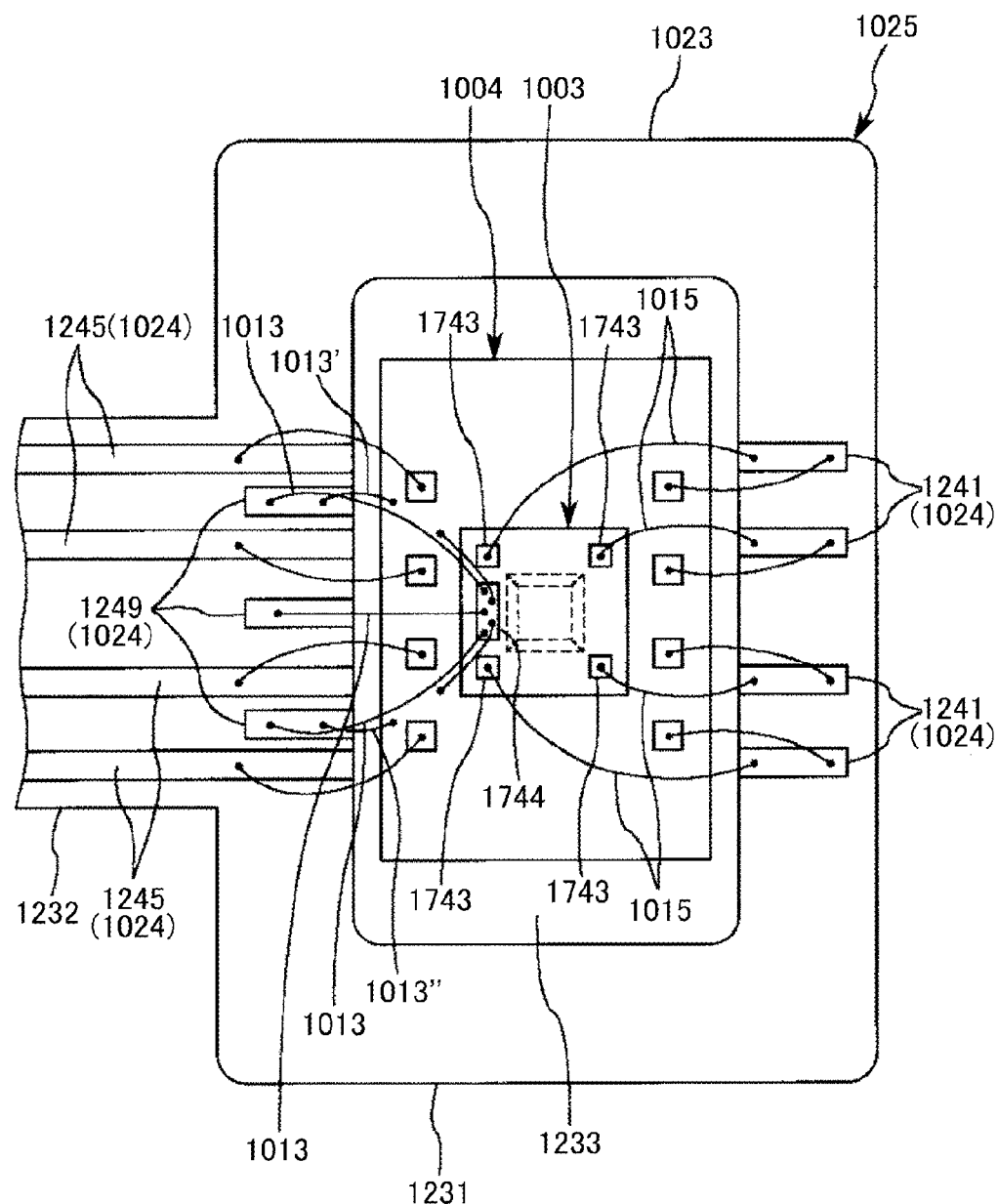
FIG. 23 is a plan view for explaining the method for manufacturing the electronic device shown in FIG. 15.
Figure 24:
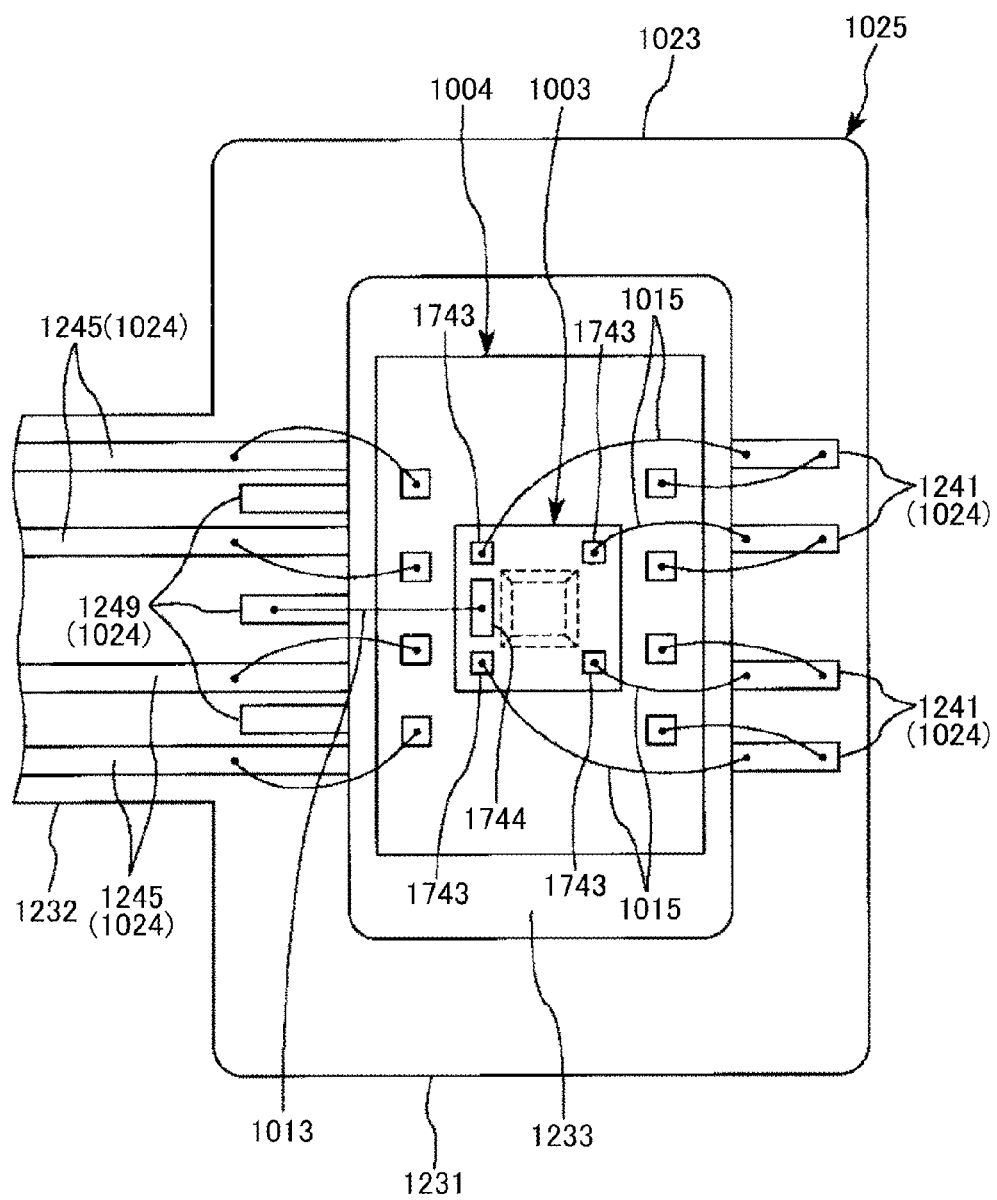
FIG. 24 is a plan view for explaining another method for manufacturing the electronic device shown in FIG. 15.
Figure 25:
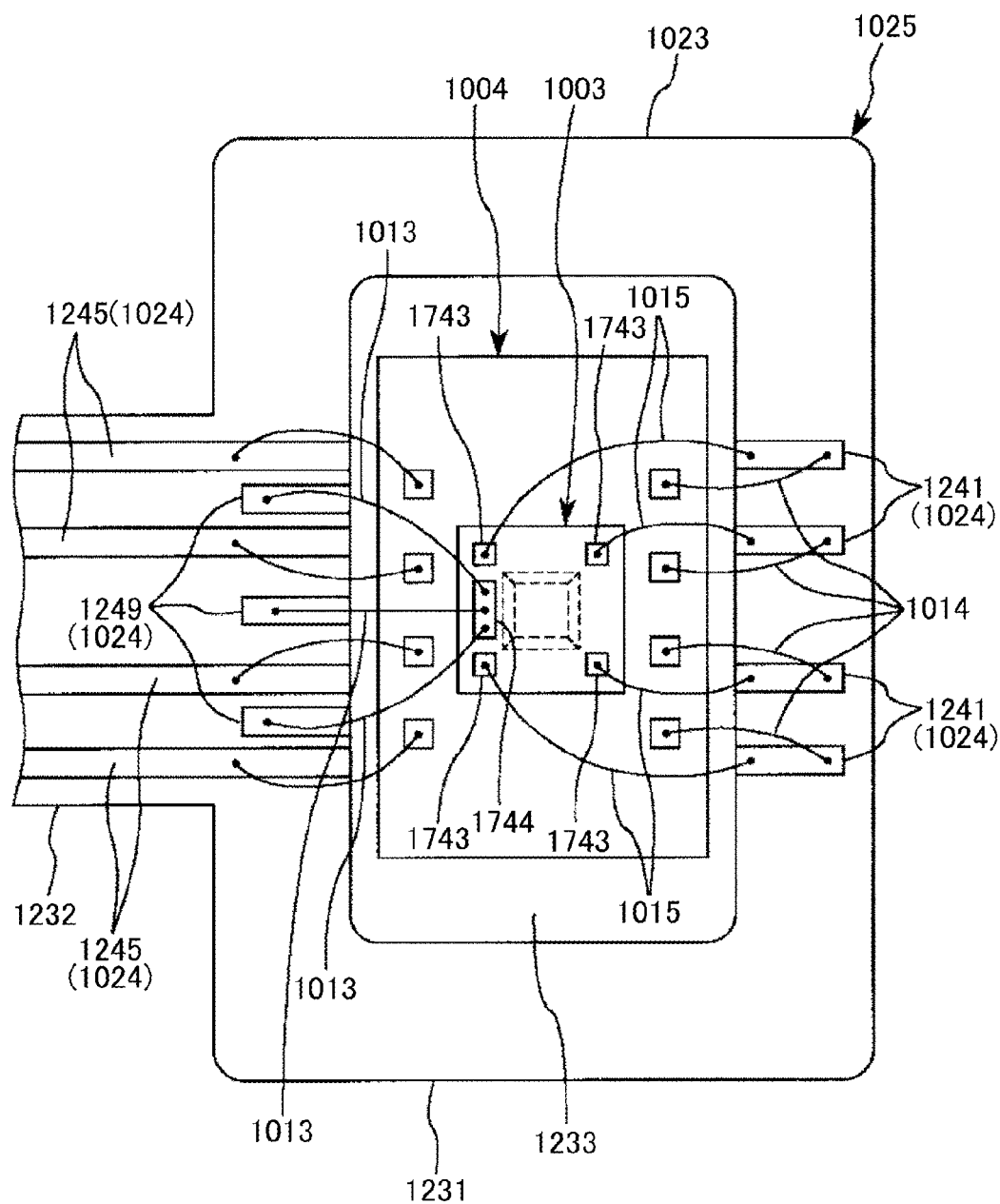
FIG. 25 is a plan view for explaining another method for manufacturing the electronic device shown in FIG. 15.

Next, a sixth embodiment of the physical quantity sensor (electronic device) will be described. FIG. 15 is a cross-sectional view showing the electronic device according to the sixth embodiment of the invention. FIG. 16 is a plan view of the electronic device shown in FIG. 15. FIG. 17 is a cross-sectional view showing a pressure sensor element provided in the electronic device shown in FIG. 15. FIG. 18 is a plan view showing a pressure sensor section of the pressure sensor element shown in FIG. 17. FIGS. 19 and 20 each explain the function of a second wire provided in the electronic device shown in FIG. 15. FIGS. 21 to 23 are plan views, each for explaining a method for manufacturing the electronic device shown in FIG. 15. FIGS. 24 and 25 are plan views, each for explaining another method for manufacturing the electronic device shown in FIG. 15. In the description below, the top side in FIGS. 15 and 17 is referred to as the "top" and the bottom side is referred to as the "bottom".

An electronic device 1001 shown in FIG. 15 has a pressure sensor element (electronic component) 1003, an IC chip (wiring board) 1004 electrically connected to the pressure sensor element 1003, a package 1002 which accommodates the pressure sensor element 1003 and the IC chip 1004, and a filler 1011 surrounding the pressure sensor element 1003 and the IC chip 1004 inside the package 1002. Each of these parts will be described in order below.

Package

The package 1002 has the function of accommodating and fixing (supporting) the pressure sensor element 1003 in an internal space 1028 formed inside.

As shown in FIG. 15, the package 1002 has a base 1021, the housing 1022, and a flexible wiring board (support board) 1025. These parts are bonded together in such a way as to hold the flexible wiring board 1025 between the base 1021 and the housing 1022. The bonding of the base 1021 and the flexible wiring board 1025, and the bonding of the housing 1022 and the flexible wiring board 1025, are respectively carried out via an adhesive layer 1026 made up of an adhesive.

The base 1021 forms the bottom surface of the package 1002. In this embodiment, the base 1021 is in the shape of a flat plate as a whole, having a square shape as viewed in a plan view. The material for forming the base 1021 is not particularly limited. However, for example, insulative materials including: oxide ceramics such as alumina, silica, titania, and zirconia; various ceramics like nitride ceramics such as silicon nitride, aluminum nitride, and titanium nitride; and various resin materials such as polyethylene, polyamide, polyimide, polycarbonate, acrylic resin, ABS resin, and epoxy resin, may be used. Of these, one type or a combination of two types or more may be used. Of these materials, various ceramics are preferable. This enables provision of the package 1002 with excellent mechanical strength. The shape of the base 1021 as viewed in a plan view may also be, for example, circular, rectangular, pentagonal or more polygonal.

The housing 1022 forms the lid section of the package 1002. In this embodiment, the housing 1022 is tubular as a whole. The housing 1022 has a part where the outer diameter and inner diameter thereof gradually decrease to a halfway point along the package height from the bottom end toward the top end. As the material for forming the housing 1022, similar materials to those listed as the materials for forming the base 1021 can be used. The shape of the housing 1022 is not particularly limited.

The flexible wiring board 1025 is situated between the base 1021 and the housing 1022 in the direction of thickness of the package 1002 and has the function of supporting the pressure sensor element 1003 and the IC chip 1004 within the package 1002 and also taking electrical signals from the pressure sensor element 1003 and the IC chip 1004 out of the package 1002. The flexible wiring board 1025 is formed by a flexible base member 1023 and a wiring 1024 formed on the top surface side of the substrate 1023.

As shown in FIG. 16, the base member 1023 is formed by a frame section 1231 which is in the shape of a substantially quadrilateral frame and has an opening 1233 in a center part, and a band body 1232 which is in the shape of a band integrally formed on one side of the frame section 1231 in a protruding manner. The material for forming the base member 1023 is not particularly limited as long as the material is flexible. For example, polyimide, polyethylene terephthalate (PET), polyethylene naphthalate (PEN), polyether sulfone (PES) and the like can be used. Of these, one type or a combination of two types or more may be used.

The wiring 1024 is electrically conductive and provided (drawn around) on the frame section 1231 and the band body 1232, as shown in FIG. 16. This wiring 1024 has four wiring parts 1241 for electrically connecting the pressure sensor element 1003 and the IC chip 1004 to each other, four wiring parts 1245 for electrically connecting the IC chip 1004 and the outside of the electronic device 1001 to each other, and three wiring parts 1249 for stress adjustment used to adjust and relax unwanted stress applied to the pressure sensor element 1003.

The four wiring parts 1241 are arranged side by side along one side 1231a of the frame section 1231. Each wiring part 1241 is electrically connected at one end part thereof (the end part on the side 1231a) to a connection terminal 1743 on the pressure sensor element 1003 via a bonding wire (first wire) 1015. With this bonding wire 1015, the pressure sensor element 1003 is supported in the state of being spaced apart from the frame section 1231 and floating with respect to the frame section 1231. Also, each wiring part 1241 is electrically connected at the other end part thereof to a connection terminal 1042 on the IC chip 1004 via a bonding wire 1014. Thus, the state where the pressure sensor element 1003 and the IC chip 1004 are electrically connected together via the wiring parts 1241 is provided.

Meanwhile, the four wiring parts 1245 are arranged respectively with the proximal end side thereof provided on the band body 1232 and with the distal end side thereof provided on the frame section 1231. The distal end parts of the four wiring parts 1245 are arranged along a side 1231b that is opposite the side 1231a. Each wiring part 1245 is electrically connected to a connection terminal 1042 on the IC chip 1004 via a bonding wire 1016. With the bonding wire 1016 and the bonding wire 1014, the pressure sensor element 1003 is supported in the state of being spaced apart from the frame section 1231 and floating with respect to the frame section 1231.

The three wiring parts 1249 are arranged along the side 1231b. The wiring parts 1249 are arranged opposite the wiring parts 1241 via the pressure sensor element 1003, as viewed in a plan view. The wiring parts 1249 are spaced apart from the wiring parts 1241, 1245 and not electrically connected to the wiring parts 1241, 1245. The wiring parts 1249 extend away from the pressure sensor element 1003, substantially orthogonally to the side 1231b.

The wiring parts 1249 are each connected to a stress correction terminal 1744 on the pressure sensor element 1003 via a bonding wire (second wire) 1013. That is, the pressure sensor element 1003 is supported to one side by the bonding wires 1015 and supported to the other side by the bonding wires 1013, and thus supported on both sides. Here, unlike the bonding wires 1015, the bonding wires 1013 are not electrically connected to the pressure sensor element 1003 or the IC chip 1004. That is, the bonding wires 1013 are not used for the electrical connection between the pressure sensor element 1003 and the IC chip 1004 or for the electrical connection between the IC chip 1004 and the outside. Thus, the generation of a short circuit (shorting) or parasitic capacitance and the generation of a noise or the like caused by the bonding wires 1013 can be prevented, and the electronic device 1001 with better characteristics is provided. The bonding wires 1013 has the function of cancelling or relaxing a stress (strain) generated in the pressure sensor element 1003 due to the connection with the bonding wires 1015, and thus reducing (adjusting) deterioration in the pressure detection capability of the pressure sensor element 1003. This function will be described in detail later.

The material for forming the bonding wires 1013, 1015 is not particularly limited. For example, various metals such as gold, copper and aluminum, and alloys containing these metals, or the like, can be used. The bonding wires 1013, 1015 may preferably contain the same material as a principal material, and may preferably have the same configuration. Also, the diameters of these wires may preferably be the same. Thus, the bonding wires 1013, 1015 can be standardized and therefore the configuration of the device can be simplified. However, the bonding wires 1013, 1015 may be made up of difference materials from each other and may have different diameters from each other.

The package 1002 is described above. According to the package 1002 with such a configuration, for example, if the motherboard or the like of an electronic apparatus or mobile object, later described, is electrically connected to the end parts of the wiring parts 1245, electrical signals from the pressure sensor element 1003 and the IC chip 1004 can be taken out of the package 1002.

The number of the wiring parts 1241, 1245 provided in the wiring 1024 is not particularly limited and can be properly set according to the number of the connection terminals 1743 provided on the pressure sensor element 1003 and the number of the connection terminals 1042 provided on the IC chip 1004. The number of the wiring parts 1249 is not particularly limited either and can be properly set on the basis of the magnitude or the like of the stress generated in the pressure sensor element 1003 due to the connection with the bonding wires 1015. Also, the material for forming the wiring 1024 is not particularly limited as long as the material is electrically conductive. For example, metals such as Ni, Pt, Li, Mg, Sr, Ag, Cu, Co, and Al, alloys containing these such as MgAg, AlLi, and CuLi, and oxides such as ITO and $SnO_2$, and the like can be used. Of these, one type or a combination of two types or more can be used.

Pressure Sensor

The pressure sensor element 1003 is an element capable of detecting the pressure applied thereto. As shown in FIG. 17, the pressure sensor element 1003 has a substrate 5, a pressure sensor section 6, an element peripheral structure 7, a cavity section 8, and a semiconductor circuit, not shown. Hereinafter, each of these parts will be described in order.

The substrate 5 is formed by stacking a first insulating film 52 made up of a silicon oxide film ($SiO_2$ film) and a second insulating film 53 made up of a silicon nitride film (SiN film) in this order on a semiconductor substrate 51 made up of an SOI substrate (a substrate made up of a first Si layer 511, an $SiO_2$ layer 512 and a second Si layer 513 stacked in this order). However, the semiconductor substrate 51 is not limited to an SOI substrate. For example, a silicon substrate can also be used.

Also, a diaphragm 1054 which is thinner than the surrounding parts and flexes and deforms on receiving pressure is provided on the semiconductor substrate 51. This diaphragm 1054 is formed by providing a closed-bottom recess section 55 on the bottom surface of the semiconductor substrate 51, and the bottom surface thereof (the bottom surface of the recess section 55) is a pressure receiving surface 1541.

A semiconductor circuit (circuit), not shown, is built in on and above the semiconductor substrate 51. The semiconductor circuit includes circuit elements such as an active element like a MOS transistor, a capacitor, an inductor, a resistor, a diode and wiring, formed according to need.

The pressure sensor section (output signal section) 6 has four piezoresistive elements 61, 62, 63, 64 which are provided in the diaphragm 1054, as shown in FIG. 18. The four piezoresistive elements 61, 62, 63, 64 are provided corresponding respectively to the respective sides of the diaphragm 1054 having a quadrilateral shape as viewed in a plan view.

The piezoresistive elements 61, 62 have piezoresistive parts 611, 621 provided at outer edge parts of the diaphragm 1054, and wirings 613, 623 connected to both ends of the piezoresistive parts 611, 621. Meanwhile, the piezoresistive elements 63, 64 have a pair of piezoresistive parts 631, 641 provided at outer edge parts of the diaphragm 1054, connection parts 632, 642 connecting the pair of piezoresistive parts 631, 641 together, and wirings 633, 643 connected to the other end parts of the pair of piezoresistive parts 631, 641.

The configurations of the piezoresistive parts 611, 621, 631, 641 and the piezoresistive elements 61, 62, 63, 64 are similar to the first embodiment and therefore will not be described further in detail here. Also, the configurations and electrical connections of the piezoresistive elements 61, 62, 63, 64 are similar to the connections in the first embodiment shown in FIG. 5 and therefore will not be described further in detail here.

The element peripheral structure 7 is formed so as to demarcate the cavity section 8. As shown in FIG. 17, the element peripheral structure 7 has an interlayer insulating film 71, a wiring layer 72 formed on the interlayer insulating film 71, an interlayer insulating film 73 formed on the wiring layer 72 and the interlayer insulating film 71, a wiring layer 74 formed on the interlayer insulating film 73, a surface protection film 75 formed on the wiring layer 74 and the interlayer insulating film 73, and a sealing layer 76. The wiring layer 74 has a coating layer 741 having a plurality of narrow holes 742 communicating the inside and outside of the cavity section 8. The sealing layer 76 arranged on the coating layer 741 seals the narrow holes 742. The wiring layers 72, 74 include wiring layers formed so as to surround the cavity section 8, and wiring layers forming the wirings on the semiconductor circuit. The semiconductor circuit is drawn out onto the top surface of the pressure sensor element 1003 by the wiring layers 72, 74. A part of the wiring layer 74 is the connection terminal 1743. The connection terminal 1743 is exposed outside from the surface protection film 75. The connection terminal 1743 is electrically connected to the wiring part 1241 via the bonding wire 1015.

Also, a part of the wiring layer 74 is the stress correction terminal 1744, and the stress correction terminal 1744 is exposed outside from the surface protection film 75, as shown in FIG. 17. The stress correction terminal 1744 is electrically connected to the wiring part 1249 via the bonding wire 1013. It is preferable that the stress correction terminal 1744 is not electrically connected to the semiconductor circuit. Thus, the electrical connection between the bonding wire 1013 and the semiconductor circuit can be prevented.

As the interlayer insulating films 71, 73, though not particularly limited, for example, an insulating film such as a silicon oxide film ($SiO_2$ film) can be used. As the wiring layers 72, 74, though not particularly limited, for example, a metal film such as an aluminum film can be used. As the sealing layer 76, though not particularly limited, a metal film of Al, Cu, W, Ti, TiN or the like can be used. As the surface protection film 75, though not particularly limited, a resistant film for protecting the elements from moisture, dust, scratches or the like, such as a silicon oxide film, silicon nitride film, polyimide film, or epoxy resin film, can be used.

The cavity section 8 demarcated by the substrate 5 and the element peripheral structure 7 is a sealed space and functions as a pressure reference chamber that provides a reference value of the pressure detected by the pressure sensor element 1003. The cavity section 8 is situated on the side opposite to the pressure receiving surface 1541 of the diaphragm 1054 and arranged so as to overlap with the diaphragm 1054. The diaphragm 1054 forms a part of a wall section that demarcates the cavity section 8. The cavity section 8 is in a vacuum state (for example, 10 Pa or below). Thus, the pressure sensor element 1003 can be used as a so-called "absolute pressure sensor element" which detects pressure on the basis of the vacuum state as a reference. However, the cavity section 8 may not be in the vacuum state and may be, for example, in an atmospheric state, a reduced-pressure state with a lower air pressure than the atmospheric pressure, or a pressurized state with a higher air pressure than the atmospheric pressure.

IC Chip

As shown in FIGS. 15 and 16, a semiconductor circuit 1041 is provided in the IC chip 1004. The semiconductor circuit 1041 includes circuit elements like an active element such as a MOS transistor, a capacitor, an inductor, a resistor, a diode and a wiring, according to need. The semiconductor circuit 1041 is electrically connected to the wiring parts 1241, 1245 via the connection terminals 1042 arranged on the top surface thereof (the surface on the side of the pressure sensor element 1003).

Here, the semiconductor circuit 1041 in the IC chip 1004 and the semiconductor circuit in the pressure sensor element 1003 include, for example, a drive circuit for supplying a voltage to the bridge circuit 60 (see FIG. 5), a temperature compensation circuit for temperature compensation of an output from the bridge circuit 60 according to the temperature of the pressure sensor, an output circuit for converting an output from the temperature compensation circuit into a predetermined output format (CMOS, LV-PECL, LVDS or the like) and outputting the converted output, or the like. The arrangement of the drive circuit, the temperature compensation circuit, the output circuit or the like is not particularly limited. For example, the drive circuit may be formed in the semiconductor circuit in the pressure sensor element 1003, and the temperature compensation circuit and the output circuit may be formed in the semiconductor circuit 1041 in the IC chip 1004. As the IC chip 1004 having the semiconductor circuit 1041 is provided as a separate part from the pressure sensor element 1003, miniaturization of the electronic device 1001 can be achieved, for example, compared with the case where the semiconductor circuit 1041 is formed within the pressure sensor element 1003, omitting the IC chip 1004.

The pressure sensor element 1003 and the IC chip 1004 are described above. The pressure sensor element 1003 is bonded to the wiring parts 1241 via the bonding wires 1015 and bonded to the wiring parts 1249 via the bonding wires 1013, as described above. Thus, the pressure sensor element 1003 is supported in the frame section 1231, and the respective connection terminals 1743 are electrically connected to the wiring parts 1241. Meanwhile, the IC chip 1004 is bonded to the wiring parts 1241, 1245 via the bonding wires 1014, 1016, as described above. Thus, the IC chip 1004 is supported in the frame section 1231, and the respective connection terminals 1042 are electrically connected to the wiring parts 1241, 1245. Thus, the pressure sensor element 1003 and the IC chip 1004 are electrically connected together via the wiring parts 1241, and an output can be made outward from the IC chip 1004 via the wiring parts 1245.

The pressure sensor element 1003 and the IC chip 1004, thus fixed, are in the state of floating (not in contact with the inner walls) within the internal space 1028 of the package 1002 via the bonding wires 1013, 1014, 1015, 1016 and the filler 1011, as shown in FIG. 15. Thus, it is difficult for oscillation or the like to be transmitted to the pressure sensor element 1003 and the IC chip 1004 via the package 1002 and therefore deterioration in the pressure detection accuracy of the electronic device 1001 can be restrained. Also, since the pressure sensor element 1003 and the IC chip 1004 arranged overlapping (vertically overlapping) with each other as viewed in a plan view, miniaturization of the electronic device 1001 can be achieved.

In this embodiment, the four bonding wires 1015 are arranged asymmetrically about a center part O (diaphragm 1054) of the pressure sensor element 1003, as viewed in a plan view. Specifically, all the bonding wires 1015 extend toward the side 1231a of the frame section 1231. As the bonding wires 1015 are thus arranged asymmetrically about the center part O, the degree of freedom in the arrangement of the wiring 1024 (wiring parts 1241) is increased, for example, compared with the case where the bonding wires are arranged symmetrically about the center part O. This facilitates the designing of the electronic device 1001 further.

Next, the function of the bonding wires 1013 will be described in detail. As described above, in the embodiment, the pressure sensor element 1003 is supported on the side of the side 1231a by the four bonding wires 1015. Therefore, if the bonding wires 1013 are not provided, there may be cases where a stress B which curves the pressure sensor element 1003 is applied to the pressure sensor element 1003, due to tensile forces A of the bonding wires 1015, as shown in FIG. 19. Moreover, with such a configuration, it is relatively difficult to control the posture of the pressure sensor element 1003, and there may be cases where the pressure sensor element 1003 tilts. There is a risk that the generation of the stress B which causes the tilting of the posture may be accelerated, or where the pressure sensor element 1003 may contact the IC chip 1004 or the like and receive a further unwanted stress due to this contact. The unwanted stress, thus generated, causes an unintended stress (stress other than pressure) to be applied to the diaphragm 1054 and consequently the received pressure cannot be detected accurately. Thus, the bonding wires 1013 are provided in order to cancel or reduce such an unwanted stress.

Specifically, as the pressure sensor element 1003 is supported by the bonding wire 1013 toward the side opposite to the bonding wires 1015, the stress B which curves the pressure sensor element 1003 is cancelled or reduced, utilizing a tensile force C of the bonding wire 1013, as shown in FIG. 20. Also, the posture of the pressure sensor element 1003 can be corrected by the bonding wire 1013. Thus, the stress generated in the diaphragm 1054 can be reduced. That is, it is difficult for an unintended and unwanted stress (stress other than the received pressure) to be applied, and the received pressure can be detected accurately.

Particularly in this embodiment, since the plurality of bonding wires 1013 is provided, the posture of the pressure sensor element 1003 can be controlled two-dimensionally with high accuracy. Moreover, as the respective bonding wires of the plurality of bonding wires 1013 are made to extend in different directions from each other, as viewed in a plan view, the posture control can be performed with higher accuracy. Also, since the wiring parts 1249 extend in the direction substantially orthogonal to the side 1231b (in the direction away from the pressure sensor element 1003), the degree of freedom of the length of the bonding wires 1013 is increased. Therefore, the stress adjustment range expands and stress adjustment can be carried out with higher accuracy.

The number of the bonding wires 1013 is not particularly limited and can be properly changed on the basis of the magnitude of the stress B, or the like. That is, the number of the bonding wires 1013 may be set in such a way as to reduce the stress B.

Filler

As shown in FIG. 15, the filler 1011 is placed to fill the internal space 1028 formed in the package 1002 and thus covers the pressure sensor element 1003 and the IC chip 1004 accommodated in the internal space 1028. With the filler 1011, the pressure sensor element 1003 and the IC chip 1004 can be protected (dustproof and waterproof) and an external stress acting on the electronic device 1001 can be reduced. The pressure applied to the electronic device 1001 acts on the pressure receiving surface 1541 of the pressure sensor element 1003 via the opening of the housing 1022 and the filler 1011.

The filler 1011 may be a substance with a softer characteristic than the pressure sensor element 1003, the IC chip 1004 and the package 1002, and may be liquid or gel-type, for example. As a specific example, a silicone oil, fluorine-based oil, silicone gel or the like can be used. In other words, the filler 1011 can be a substance with a lower Young's modulus than the pressure sensor element 1003 and the IC chip 1004. The viscosity of the filler 1011 is not particularly limited. However, for example, the filler may have a penetration preferably within a range of 50 or above and 250 or below, and more preferably within a range of 150 or above and 250 or below. Thus, the filler 1011 can be made sufficiently soft and the pressure applied to the electronic device 1001 acts efficiently on the pressure receiving surface 1541.

The configuration of the electronic device 1001 is described in detail above. Next, a method for manufacturing the electronic device 1001 will be described.

The method for manufacturing the electronic device 1001 includes: a connection process in which the IC chip 1004 and the pressure sensor element 1003 are connected together using a plurality of bonding wires 1013, 1015; a measurement process in which electrical characteristics of the pressure sensor element 1003 are measured; a stress adjustment process in which at least one of the connections of the plurality of bonding wires 1013 is cancelled according to need on the basis of the result of the measurement; and an accommodation process in which the IC chip and the pressure sensor element 1003 are accommodated in the package 1002.

Connection Process

First, the flexible wiring board 1025 and the IC chip 1004 are prepared, and the flexible wiring board 1025 and the IC chip 1004 are connected together via the bonding wires 1014, 1016, as shown in FIG. 21. This connection can be carried out using a wire bonding method. Next, the pressure sensor element 1003 is prepared, and the flexible wiring board 1025 and the pressure sensor element 1003 are connected together via the bonding wires 1013, 1015, as shown in FIG. 22. This connection can be carried out using a wire bonding method. In this state, it is preferable that a relatively large number of bonding wires 1013 are provided so as to generate a tensile force equal to or larger than a force to cancel the stress generated in the pressure sensor element 1003 due to the connection with the bonding wires 1015. Also, the tensile force of at least one bonding wire 1013 may be different from the tensile force of the other bonding wires 1013. Thus, in the stress adjustment process, it is possible to choose which bonding wire 1013 to cut, thus enabling more appropriate stress adjustment.

Measurement Process

Next, electrical characteristics of the pressure sensor element 1003 are measured. Specifically, for example, first, the pressure sensor element 1003 is placed in a predetermined (known) pressure atmosphere and the pressure is detected in this state. Then, the detected pressure (output value) is compared with the actual pressure, thus obtaining error information. It is considered that, as the error is greater, a greater unwanted stress is applied to the pressure sensor element 1003.

Stress Adjustment Process

Next, as shown in FIG. 23, based on the error information obtained in the measurement process, the connection of at least one of the plurality of bonding wires 1013 (in FIG. 23, two bonding wires 1013', 1013") is cancelled. Thus, the tensile force of the bonding wires 1013 is reduced and the stress applied to the pressure sensor element 1003 is reduced accordingly. Then, the error of the pressure (output value) detected by the pressure sensor element 1003 with respect to the actual pressure is made to fall within a predetermined range. The method for cancelling the connection of the bonding wire 1013 is not particularly limited. However, for example, a method that uses a laser to cut or remove the bonding wire 1013 may be used. Thus, the connection of the bonding wire 1013 can be cancelled easily. Also, since the use of the laser only involves local heating on the bonding wire 1013, thermal damage to the other parts (particularly the pressure sensor element 1003 and the IC chip 1004) can be reduced.

It is also possible to repeat the measurement process and this stress adjustment process so as to cause the error to fall within a predetermined range gradually. Also, if the error information obtained in the measurement process is within the predetermined range from the beginning, the stress adjustment process can be omitted.

Accommodation Process

Next, the base 1021 and the housing 1022 are prepared and bonded together in such a way that the flexible wiring board 1025 is held between the base 1021 and the housing 1022. The package 1002 is thus provided and the state where the pressure sensor element 1003 and the IC chip 1004 are accommodated in the package 1002 is achieved. Finally, the filler 1011 is injected into the package 1002. The electronic device 1001 is thus provided.

According to the manufacturing method as described above, the electronic device 1001 having an excellent pressure detection characteristic, that is, having only a small measurement error, can be manufactured easily.

Meanwhile, the electronic device 1001 can also be manufactured by the following method.

Another method for manufacturing the electronic device 1001 includes: a connection process in which the IC chip 1004 and the pressure sensor element 1003 are connected together using a plurality of bonding wires 1015 and a single bonding wire 1013; a measurement process in which electrical characteristics of the pressure sensor element 1003 are measured; a stress adjustment process in which another bonding wire 1013 for connecting the IC chip 1004 and the pressure sensor element 1003 is added according to need on the basis of the result of the measurement in the measurement process; and an accommodation process in which the IC chip 1004 and the pressure sensor element 1003 are accommodated in the package 1002.

Connection Process

First, the flexible wiring board 1025 and the IC chip 1004 are prepared, and the flexible wiring board 1025 and the IC chip 1004 are connected together via the bonding wires 1014, 1016. Next, the pressure sensor element 1003 is prepared, and the flexible wiring board 1025 and the pressure sensor element 1003 are connected together via the plurality of bonding wires 1015 and the single bonding wire 1013, as shown in FIG. 24. The number of the bonding wires 1013 connected in this process is not limited to one but may be two or more.

Measurement Process

Next, electrical characteristics of the pressure sensor element 1003 are measured. Specifically, for example, first, the pressure sensor element 1003 is placed in a predetermined (known) pressure atmosphere and the pressure is detected in this state. Then, the detected pressure (output value) is compared with the actual pressure, thus obtaining error information. It is considered that, as the error is greater, a greater unwanted stress is applied to the pressure sensor element 1003.

Stress Adjustment Process

Next, as shown in FIG. 25, based on the error information obtained in the measurement process, the flexible wiring board 1025 and the pressure sensor element 1003 are connected together via at least one additional bonding wire 1013. That is, a bonding wire 1013 is added. Thus, the stress applied to the pressure sensor element 1003 is reduced, utilizing the tensile force of the additional bonding wire 1013, and the error of the pressure (output value) detected by the pressure sensor element 1003 with respect to the actual pressure is made to fall within a predetermined range.

It is also possible to repeat the measurement process and this stress adjustment process so as to cause the error to fall within a predetermined range gradually. Also, if the error information obtained in the measurement process is within the predetermined range from the beginning, the stress adjustment process can be omitted.

Accommodation Process

Next, the base 1021 and the housing 1022 are prepared and bonded together in such a way that the flexible wiring board 1025 is held between the base 1021 and the housing 1022. The package 1002 is thus provided and the state where the pressure sensor element 1003 and the IC chip 1004 are accommodated in the package 1002 is achieved. Finally, the filler 1011 is injected into the package 1002. The electronic device 1001 is thus provided.

According to the manufacturing method as described above, the electronic device 1001 having an excellent pressure detection characteristic, that is, having only a small measurement error, can be manufactured easily.

Seventh Embodiment

Figure 26:
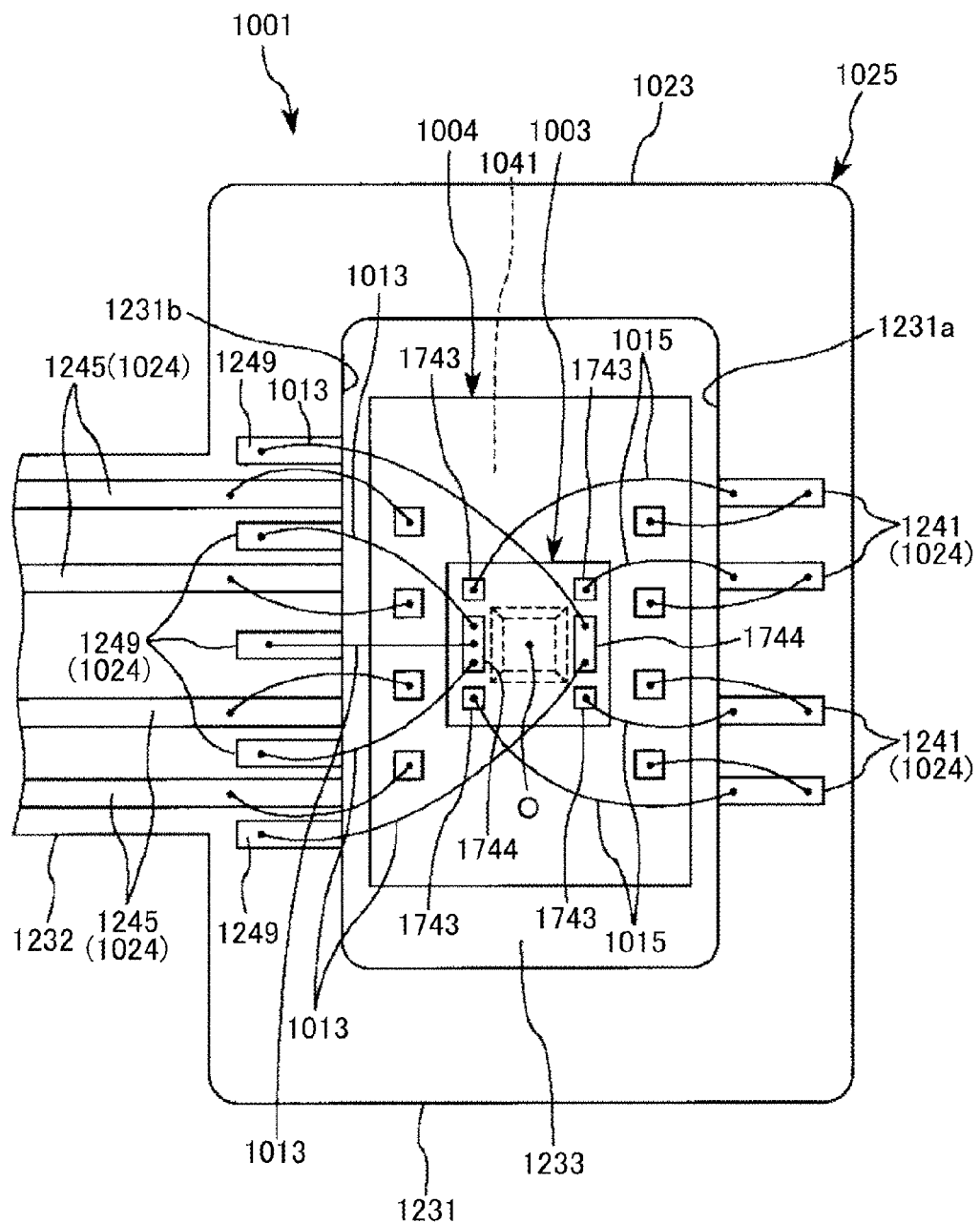
FIG. 26 is a plan view showing an electronic device according to a seventh embodiment of the invention.

Next, a seventh embodiment of the physical quantity sensor (electronic device) will be described. FIG. 26 is a plan view showing the electronic device according to the seventh embodiment of the invention. Hereinafter, the seventh embodiment of the electronic device will be described, mainly in terms of the differences from the foregoing embodiment and omitting the description of similar features.

The seventh embodiment is similar to the sixth embodiment, except that the arrangement of the second wire (arrangement of the stress correction terminal) is different.

As shown in FIG. 26, in the electronic device 1001 of this embodiment, the stress correction terminal 1744 is provided both toward the side of the side 1231*a* from the center part O of the pressure sensor element 1003 and toward the side of the side 1231*b* from the center part O, and the respective stress correction terminals 1744 and the wiring parts 1249 are connected together via the bonding wires 1013. As the stress correction terminal 1744 is thus provided on both sides of the center part O, the cancellation or relaxation of the stress and the posture control as described in the sixth embodiment can be carried out effectively.

The seventh embodiment can achieve similar effects to the sixth embodiment.

Eighth Embodiment

Figure 27:
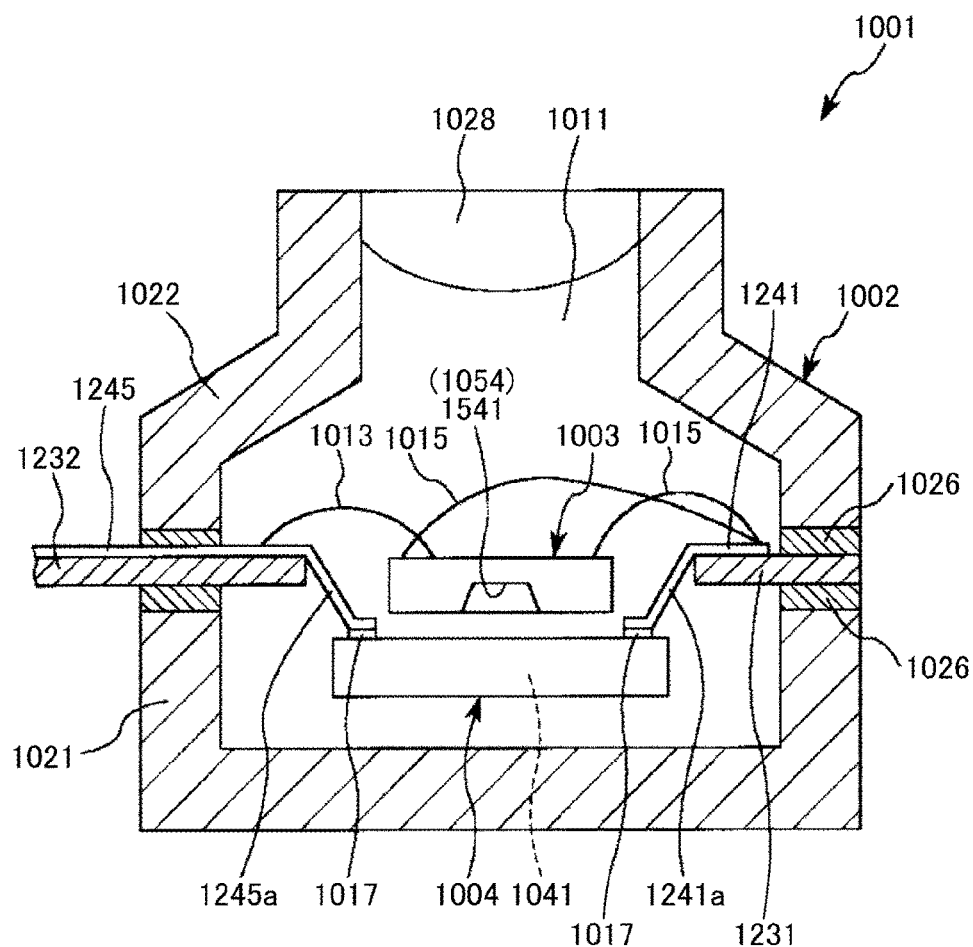
FIG. 27 is a cross-sectional view showing an electronic device according to an eighth embodiment of the invention.
Figure 28:
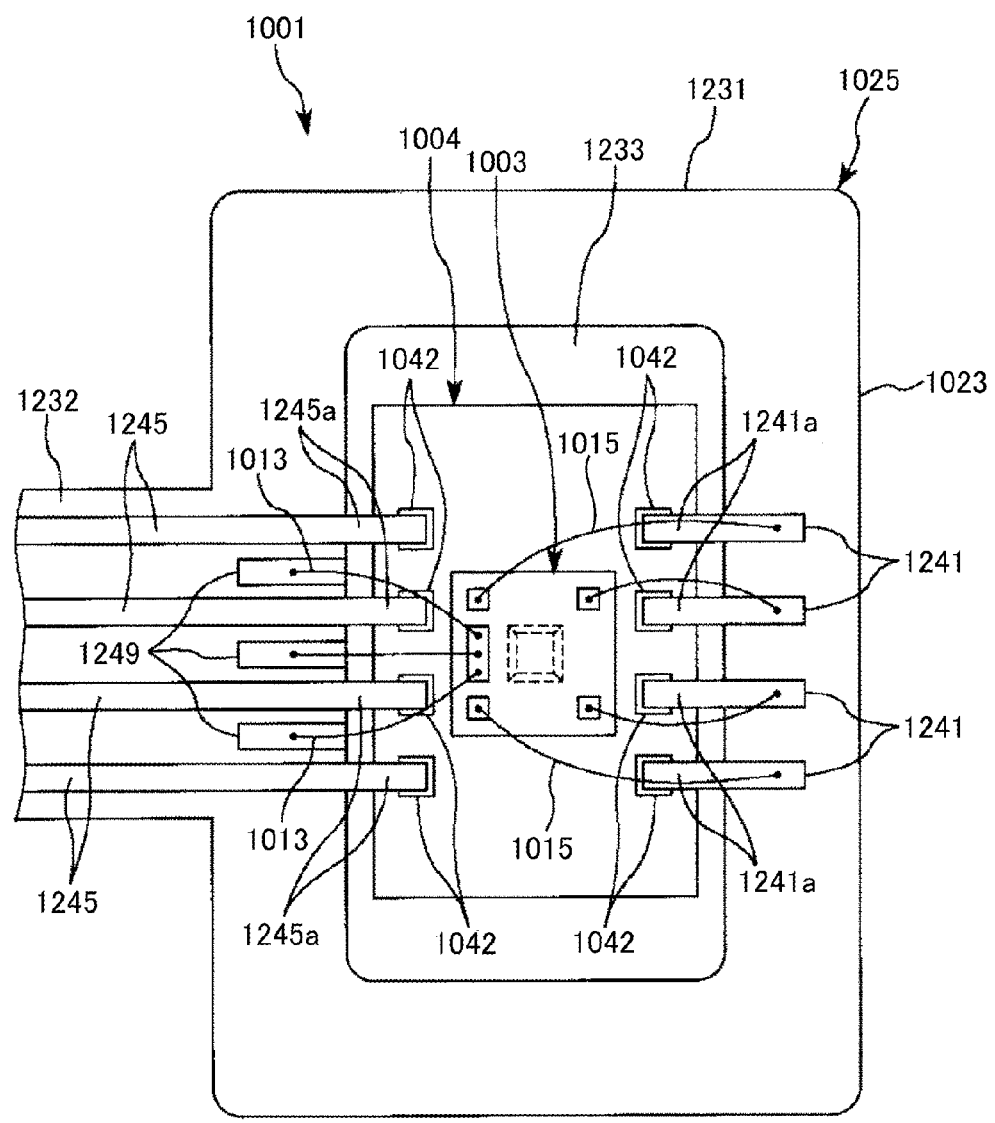
FIG. 28 is a plan view of the electronic device shown in FIG. 27.

Next, an eighth embodiment of the physical quantity sensor (electronic device) will be described. FIG. 27 is a cross-sectional view showing the electronic device according to the eighth embodiment of the invention. FIG. 28 is a plan view of the electronic device shown in FIG. 27. Hereinafter, the eighth embodiment of the electronic device will be described, mainly in terms of the differences from the sixth and seventh embodiments and omitting the description of similar features.

The eighth embodiment is similar to the sixth embodiment, except that the method for connecting the IC chip and the flexible wiring board is different.

As shown in FIGS. 27 and 28, in the electronic device 1001 of this embodiment, one-end parts of the wiring parts 1241, 1245 are flying leads 1241a, 1245a protruding into the opening 1233. The IC chip 1004 is fixed to the distal end parts of the flying leads 1241a, 1245a via electrically conductive fixing members 1017, and the connection terminals 1042 and the flying leads 1241a, 1245a are electrically connected together via the fixing members 1017. The fixing members 1017 are not particularly limited. For example, a metal brazing material such as solder, a metal bump such as gold bump, an electrically conductive adhesive, or the like, can be used.

The eighth embodiment can achieve similar effects to the sixth embodiment.

Ninth Embodiment

Figure 29:
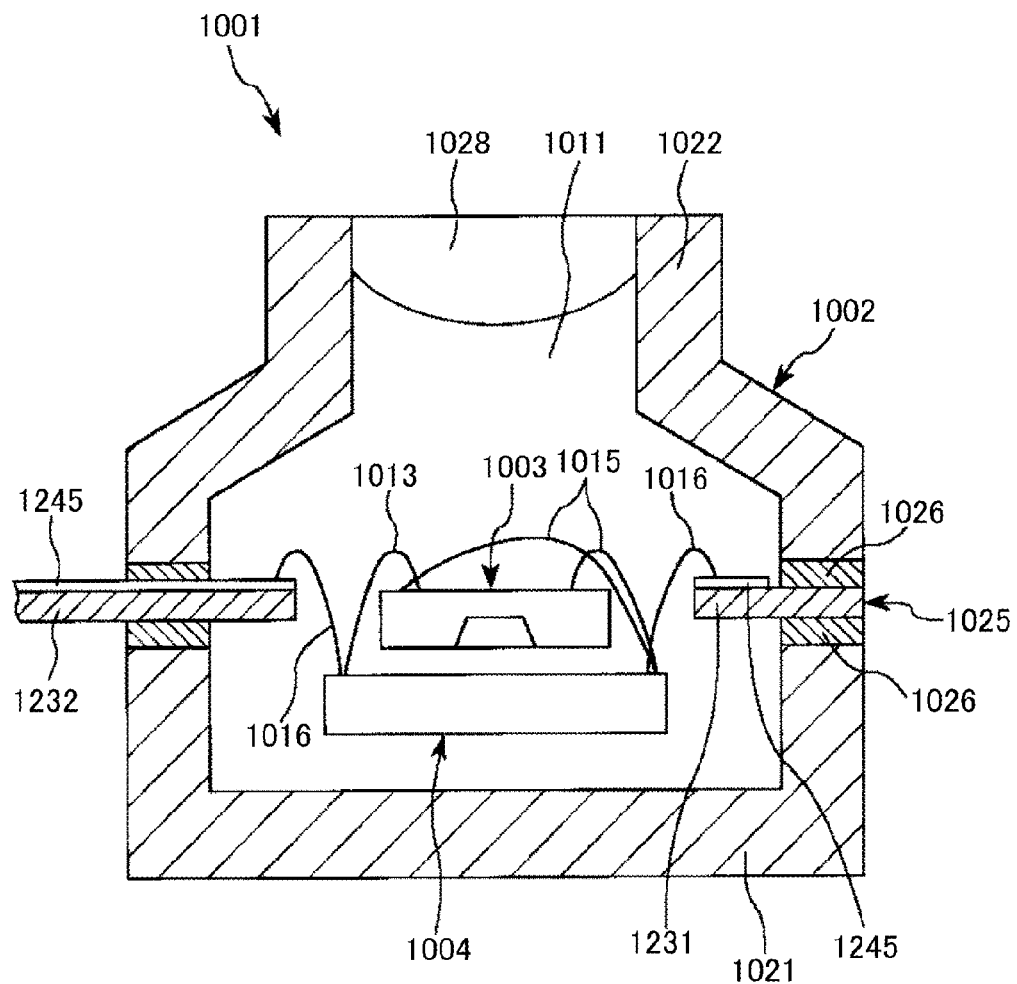
FIG. 29 is a cross-sectional view showing an electronic device according to a ninth embodiment of the invention.
Figure 30:
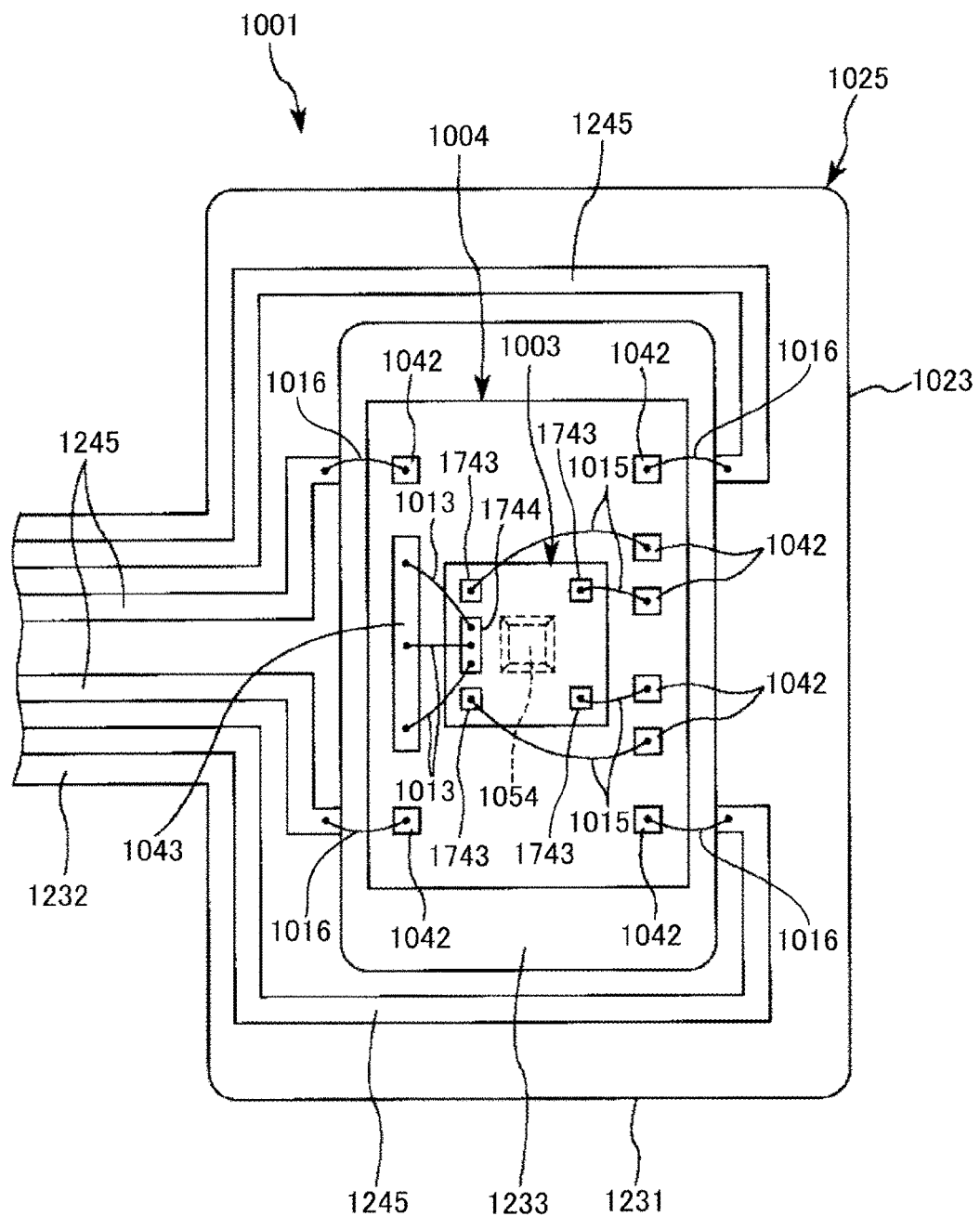
FIG. 30 is a plan view of the electronic device shown in FIG. 29.

Next, a ninth embodiment of the physical quantity sensor (electronic device) will be described. FIG. 29 is a cross-sectional view showing the electronic device according to the ninth embodiment of the invention. FIG. 30 is a plan view of the electronic device shown in FIG. 29. Hereinafter, the ninth embodiment of the electronic device will be described, mainly in terms of the differences from the sixth to eighth embodiments and omitting the description of similar features.

The ninth embodiment is similar to the sixth embodiment, except that the method for connecting the IC chip and the pressure sensor element is different.

As shown in FIGS. 29 and 30, in the electronic device 1001 of this embodiment, the pressure sensor element 1003 is directly connected to the IC chip 1004 via the bonding wires 1013, 1015. That is, the pressure sensor element 1003 is connected to the IC chip 1004 without using the flexible wiring board 1024 (wiring parts 1241). Thus, the wiring length can be reduced and the generation of a noise can be restrained. Also, miniaturization of the device can be achieved. In this embodiment, to achieve this configuration, a stress correction terminal 1043 that is equivalent to the wiring parts 1249 for stress correction is arranged on the top surface of the IC chip 1004, spaced apart from the connection terminals 1042, and the stress correction terminal 1043 and the stress correction terminal 1744 are connected together via the bonding wires 1013.

The ninth embodiment can achieve similar effects to the sixth embodiment.

2. Altimeter

Figure 31:
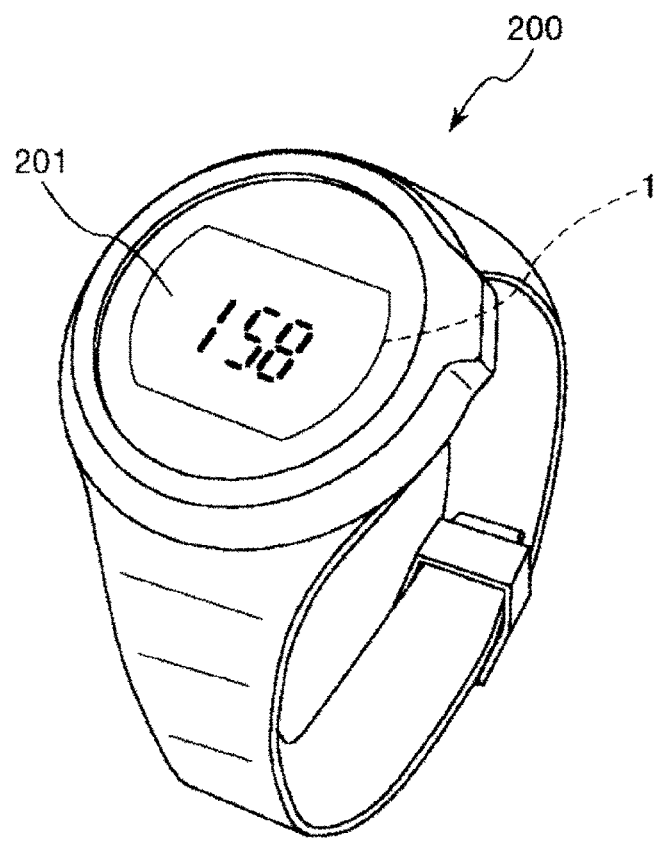
FIG. 31 is a perspective view showing an altimeter as an example of the electronic apparatus according to the invention.

Next, an example of an altimeter having the physical quantity sensor (electronic device) according to the invention will be described. FIG. 31 is a perspective view showing an example of the altimeter according to the invention.

As shown in FIG. 31, an altimeter 200 can be put on the wrist like a wristwatch. The physical quantity sensor (electronic device) 1 is installed inside the altimeter 200. The altitude above sea level at the present location or the air pressure at the present location or the like can be displayed in a display section 201.

In the display section 201, various kinds of information such as the present time, user's heart rate and weather can be displayed.

3. Electronic Apparatus

Figure 32:
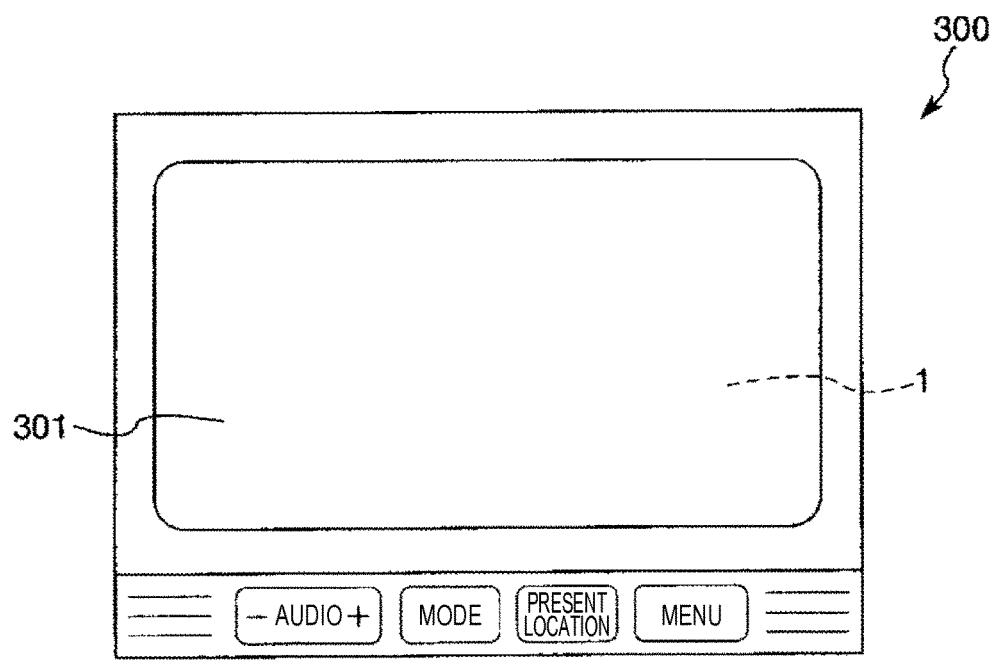
FIG. 32 is a front view showing a navigation system as an example of the electronic apparatus according to the invention.

Next, a navigation system as an example of an electronic apparatus having the physical quantity sensor (electronic device) according to the invention will be described. FIG. 32 is a front view showing the navigation system as an example of the electronic apparatus according to the invention.

As shown in FIG. 32, a navigation system 300 has: map information, not shown; a unit for acquiring position information from the GPS (Global Positioning System); an autonomous navigation unit based on a gyro sensor, an acceleration sensor and vehicle speed data; the physical quantity sensor (electronic device) 1; and a display section 301 for displaying predetermined position information or route information.

According to this navigation system, altitude information can be acquired in addition to the acquired position information. By obtaining altitude information, it is possible to cope with cases as follows. For example, in the case of travelling on an elevated road which is at substantially the same position as an ordinary road in terms of position information, if altitude information is not provided, the navigation system cannot determine whether the vehicle is travelling on the ordinary road or on the elevated road, and provides the user with information of the ordinary road as priority information. Meanwhile, the navigation system 300 according to the embodiment can acquire altitude information via the physical quantity sensor 1, detect change in altitude due to entry to the elevated road from the ordinary road, and provides the user with navigation information relevant to the elevated road travelling state.

The display section 301 can be formed in a small size and thickness, for example, using a liquid crystal panel display, organic EL (Electro-Luminescence) display or the like.

It should be noted that the electronic device having the physical quantity sensor according to the invention is not limited to the above examples and can also be applied to, for example, a personal computer, mobile phone, medical apparatus (for example, electronic thermometer, blood pressure gauge, blood glucose monitor, electrocardiography device, ultrasonic diagnostic device, and electronic endoscope), various measuring devices, instruments (for example, instruments on vehicle, aircraft, and ship), flight simulator, and the like.

4. Mobile object

Figure 33:
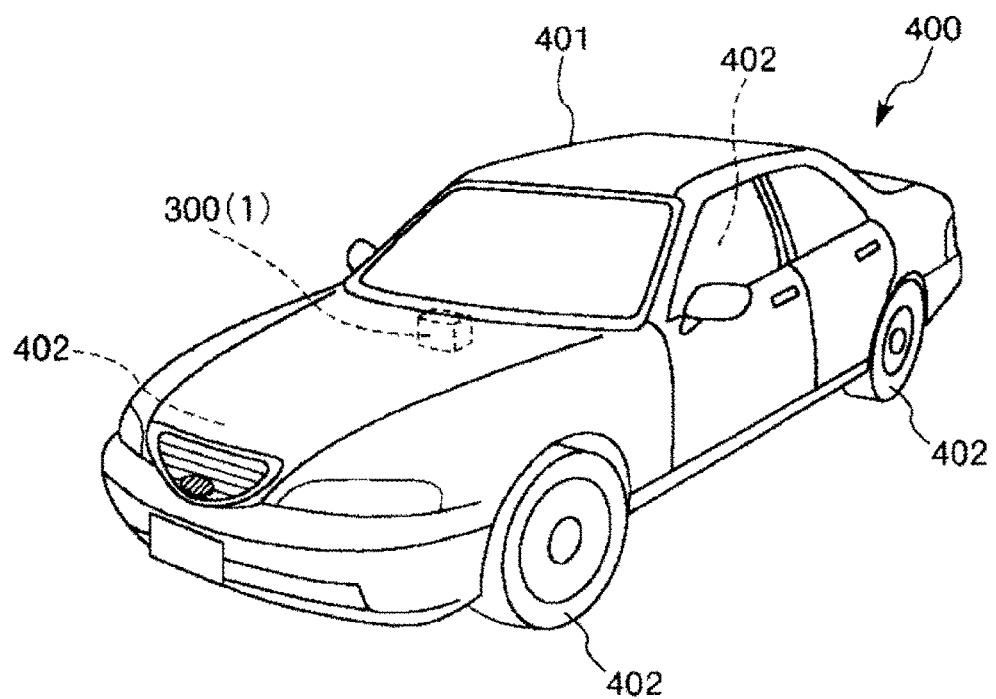
FIG. 33 is a perspective view showing an example of the mobile object according to the invention.

Next, a mobile object having the physical quantity sensor (electronic device) according to the invention will be described. FIG. 33 is a perspective view showing an example of the mobile object according to the invention.

As shown in FIG. 33, a mobile object 400 has a vehicle body 401 and four wheels 402 and is configured in such a way that the wheels 402 are rotated by a power source (engine), not shown, provided in the vehicle body 401. The navigation system 300 (physical quantity sensor 1) is installed inside the mobile object 400.

The physical quantity sensor (electronic device), the altimeter, the electronic apparatus and the mobile object according to the invention are described on the basis of the respective illustrated embodiments. However, the invention is not limited to these embodiments. The configuration of each part can be replaced with an arbitrary configuration having similar functions. Also, another arbitrary component or process may be added. Moreover, the respective embodiments may be combined suitably.

In the embodiments, the case where piezoresistive elements are used as the sensor elements provided in the physical quantity sensor chip (electronic component), or the like, is described. However, the sensor elements are not limited to this example and, for example, other forms of oscillation elements, such as a MEMS oscillator with comb electrodes or a crystal oscillator.

In the embodiments, the configuration in which the IC chip is arranged overlapping (vertically overlapping) with the physical quantity sensor chip as viewed in a plan view is described. However, the IC chip may be arranged side by side with the physical quantity sensor chip in a horizontal direction.

What is claimed is:

1. An electronic device comprising:
   a wiring board;
   an electronic component;
   a first wire which electrically connects the wiring board and the electronic component together and generates a stress on the electronic component; and
   a second wire which connects the wiring board and the electronic component together in such a way as to adjust the stress.

2. The electronic device according to claim 1, comprising a plurality of the first wires,
   wherein an arrangement of the first wires is asymmetrical about a center part of the electronic component, as viewed in a plan view.

3. The electronic device according to claim 1, wherein the second wire is not electrically connected to the wiring board.

4. The electronic device according to claim 1, wherein the second wire is not electrically connected to the electronic component.

5. The electronic device according to claim 1, wherein a circuit is provided on the wiring board.

6. The electronic device according to claim 1, wherein the electronic component is a pressure sensor element having a diaphragm.

7. The electronic device according to claim 1, wherein the first wire and the second wire contain a same metal material as a principal material.

8. The electronic device according to claim 1, wherein the wiring board and the electronic component are directly connected together by the first wire and the second wire.

9. An altimeter comprising the electronic device according to claim 1.

10. An electronic apparatus comprising the electronic device according to claim 1.

11. A mobile object comprising the electronic device according to claim 1.

12. A pressure sensor comprising:
    a package having an internal space;
    a pressure sensor chip configured to detect a pressure, the pressure sensor chip having a pressure receiving surface that faces a bottom of the package;
    a flexible wiring board having at least a part thereof that protrudes into the internal space of the package; and
    a first wire that electrically connects the flexible wiring board to the pressure sensor chip, the first wire being connected to each of the pressure sensor chip and the flexible wiring board at surfaces thereof, respectively, that face an opening of the package;
    wherein the pressure sensor chip is moored in the internal space by the first wire.

13. The physical quantity sensor according to claim 12, wherein the pressure sensor chip is surrounded by a liquid or gel-type filler.

14. The physical quantity sensor according to claim 13, wherein the filler includes a pliable resin.

15. The physical quantity sensor according to claim 12, wherein an IC chip is arranged in the internal space.

16. The physical quantity sensor according to claim 15, further comprising second wire which connects the package and the IC chip together,
    wherein the IC chip is moored in the internal space by the second wire.

17. The physical quantity sensor according to claim 15, wherein the IC chip is integrally formed with the pressure sensor chip.

18. An electronic apparatus comprising the pressure sensor according to claim 12.

19. A mobile object comprising the pressure sensor according to claim 12.

* * * * *